United States Patent
Ise et al.

(10) Patent No.: US 7,179,544 B2
(45) Date of Patent: Feb. 20, 2007

(54) ORGANIC ELECTROLUMINESCENT ELEMENT

(75) Inventors: Toshihiro Ise, Kanagawa (JP); Tatsuya Igarashi, Kanagawa (JP); Hisashi Okada, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 142 days.

(21) Appl. No.: 10/735,700

(22) Filed: Dec. 16, 2003

(65) Prior Publication Data

US 2004/0124769 A1    Jul. 1, 2004

(30) Foreign Application Priority Data

Dec. 17, 2002  (JP)  ............................ P.2002-365281

(51) Int. Cl.
*H01L 51/50*  (2006.01)
*H05B 33/14*  (2006.01)

(52) U.S. Cl. ...................... 428/690; 428/917; 313/504; 313/506

(58) Field of Classification Search ................ 428/690, 428/917; 313/504, 506
See application file for complete search history.

(56) References Cited

U.S. PATENT DOCUMENTS 6,821,645 B2 * 11/2004 Igarashi et al. ............. 428/690
6,835,469 B2 * 12/2004 Kwong et al. ............. 428/690

FOREIGN PATENT DOCUMENTS

| JP | 2000302754 A | * 10/2000 |
| JP | 2001247859 A | * 9/2001 |
| JP | 2002-305083 A | 10/2002 |
| WO | WO 02/079343 | * 10/2002 |

* cited by examiner

*Primary Examiner*—Dawn Garrett
(74) *Attorney, Agent, or Firm*—Sughrue Mion, PLLC

(57) ABSTRACT

An organic electroluminescent element comprising: a pair of electrodes; and an organic layer provided between the pair of electrodes, the organic layer comprising a light-emitting layer and an electron transporting layer, wherein the light-emitting layer contains at least one phosphorescence-emitting material and at least one metal complex functioning as a host material, and the electron transporting layer contains a compound represented by the formula (E-I):

$$L\text{-}(A)_m \qquad (E\text{-}I)$$

wherein A represents a monovalent heterocyclic group wherein two or more aromatic hetero rings are condensed, the heterocyclic groups represented by A is the same or different from each other, m represents an integer of 2 or more, and L represents an m-valent linking group.

20 Claims, No Drawings

ORGANIC ELECTROLUMINESCENT ELEMENT

FIELD OF THE INVENTION

The present invention relates to an organic electroluminescent element (organic EL element) capable of emitting light with a high luminance and a high efficiency and having an excellent durability.

BACKGROUND OF THE INVENTION

In recent years, vigorous research and development have been conducted on organic EL elements, since they emit light with a high luminance at a low driving voltage. In general, the organic EL element is constituted by opposed electrodes having sandwiched therebetween a light-emitting layer or a plurality of organic layers including a light-emitting layer, in which element electrons injected from a cathode and holes injected from an anode are recombined in the light-emitting layer to generate excitons which emit light or which transports energy to other molecules to generate light-emitting excitons. The thus-emitted light is utilized.

An invention relating to a phosphorescent light-emitting organic EL element using a metal complex as a host material has been disclosed (see JP-A-2002-305083). In Examples of this patent literature, tris (8-hydroxyquinoline) aluminum complex (Alq) is used as an electron transporting material, and an aluminum complex layer, called HB-1 in this patent literature, is sandwiched as a hole-blocking layer between a light-emitting layer and an electron transporting layer (Alq layer). Thus, light-emitting efficiency and durability of the element are still insufficient and, therefore, development of an element showing a high luminance and a high light-emitting efficiency and having an excellent durability has been eagerly demanded.

SUMMARY OF THE INVENTION

An object of the invention is to provide an organic EL element which emits light with a high luminance and a high efficiency, and which is excellent in durability and, further, to provide an organic EL element which has a simple structure wherein no other layers exist between a light-emitting layer and an electron transporting layer.

The above-described problems can be solved by the following organic electroluminescent element:

(1) An organic electroluminescent element having an organic layer including at least both a light-emitting layer and an electron transporting layer between a pair of electrodes, wherein the light-emitting layer contains at least one phosphorescence-emitting material and at least one metal complex functioning as a host material, and the electron transporting layer contains a compound represented by the following formula (E-I):

(E-I)

wherein A represents a monovalent heterocyclic group (monovalent hetero ring group) wherein two or more aromatic hetero rings are condensed, with the heterocyclic groups represented by A being the same or different from each other, m represents an integer of 2 or more, and L represents an m-valent linking group (2) The organic electroluminescent element as described in the above (1), wherein the compound represented by the formula (E-I) is a compound represented by the following formula (E-II):

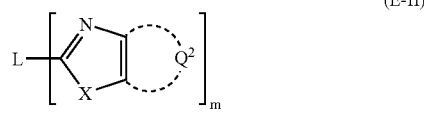

(E-II)

wherein X represents O, S, Se, Te or N—R, R represents a hydrogen atom, an aliphatic hydrocarbon group (aliphatic hydrocarbyl group), an aryl group or a heterocyclic group, $Q^2$ represents atoms necessary for forming an aromatic hetero ring, m represents an integer of 2 or more, and L represents an m-valent linking group.

(3) The organic electroluminescent element as described in the above (1) or (2), wherein the compound represented by the formula (E-I) is a compound represented by the following formula (E-III):

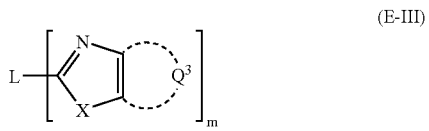

(E-III)

wherein X represents O, S, Se, Te or N—R, R represents a hydrogen atom, an aliphatic hydrocarbon group, an aryl group or a heterocyclic group, $Q^3$ represents atoms necessary for forming a nitrogen-containing aromatic hetero ring, m represents an integer of 2 or more, and L represents an m-valent linking group.

(4) The organic electroluminescent element as described in one of the above (1) to (3), wherein the compound represented by the formula (E-I) is a compound represented by the following formula (E-IV):

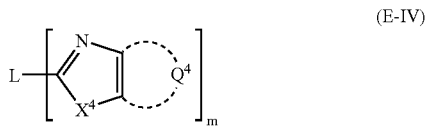

(E-IV)

wherein $X^4$ represents O, S or N—R, R represents a hydrogen atom, an aliphatic hydrocarbon group, an aryl group or a heterocyclic group, $Q^4$ represents atoms necessary for forming a 6-membered, nitrogen-containing aromatic hetero ring, m represents an integer of from 2 to 8, and L represents an m-valent linking group.

(5) The organic electroluminescent element as described in one of the above 1 to 4, wherein the compound represented by the formula (E-I) is a compound represented by the following formula (E-V):

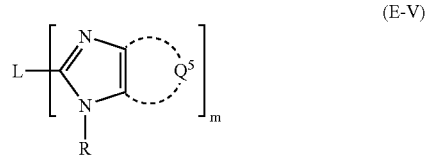

(E-V)

wherein R represents a hydrogen atom, an aliphatic hydrocarbon group, an aryl group or a heterocyclic group, $Q^5$ represents atoms necessary for forming a 6-membered, nitrogen-containing aromatic hetero ring, m represents an integer of from 2 to 8, and L represents an m-valent linking group.

(6) The organic electroluminescent element as described in one of the above (1) to (5), wherein the compound represented by the formula (E-I) is a compound represented by the following formula (E-VI):

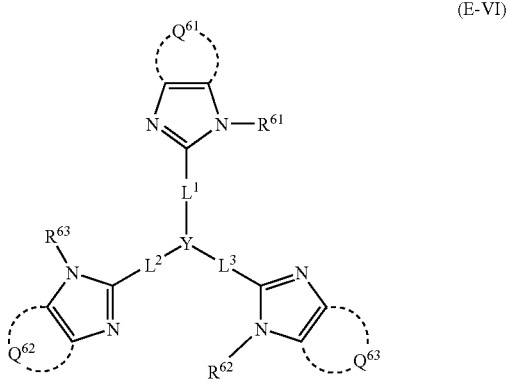

(E-VI)

wherein $Q^{61}$, $Q^{62}$ and $Q^{63}$ each represents atoms necessary for forming a 6-membered, nitrogen-containing aromatic hetero ring, $R^{61}$, $R^{62}$ and $R^{63}$ each represents a hydrogen atom, an aliphatic hydrocarbon group, an aryl group or a heterocyclic group, $L^1$, $L^2$ and $L^3$ each represents a divalent linking group, and Y represents a nitrogen atom or a 1,3,5-benzenetriyl group.

(7) The organic electroluminescent element as described in one of the above (1) to (6), wherein the compound represented by the formula (E-I) is a compound represented by the following formula (E-VII):

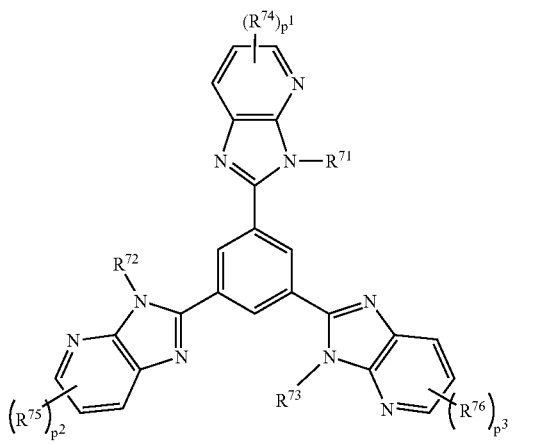

(E-VII)

wherein $R^{71}$, $R^{72}$ and $R^{73}$ each represents a hydrogen atom, an aliphatic hydrocarbon group, an aryl group or a heterocyclic group, $R^{74}$, $R^{75}$ and $R^{76}$ each represents a substituent, and $p^1$, $p^2$ and $p^3$ each represents an integer of 0 to 3.

(8) The organic electroluminescent element as described in one of the above (1) to (7), wherein no layers exist between the light-emitting layer and the electron transporting layer.

(9) The organic electroluminescent element as described in one of the above (1) to (8), wherein the metal complex functioning as a host material is that represented by the following formula (H-1)

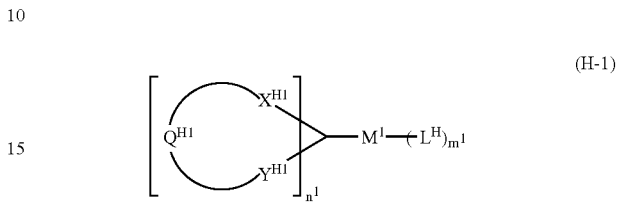

(H-1)

wherein, $X^{H1}$ represents an oxygen atom, a nitrogen atom, a sulfur atom, a carbon atom or a phosphorus atom, which may have a substituent if possible, or may be an atom constituting another ring; $Y^{H1}$ represents an oxygen atom, a nitrogen atom, a sulfur atom, a carbon atom or a phosphorus atom, which may have a substituent if possible, or may be an atom constituting another ring; $M^1$ represents a metal ion; $n^1$ represents an integer of 1 or more; $L^H$ represents a ligand; $m^1$ represents an integer of 0 or more; and $Q^{H1}$ represents, together with $X^{H1}$, $Y^{H1}$ and $M^1$, a group of atoms constituting a chelate ring. The type of the bonds between the individual atoms in the formula may be a single bond, a double bond, a triple bond or a coordinate bond.

(10) The organic electroluminescent element as described in one of the above (1) to (9), wherein the metal complex functioning as a host material is that represented by the following formula (H-2) or (H-3):

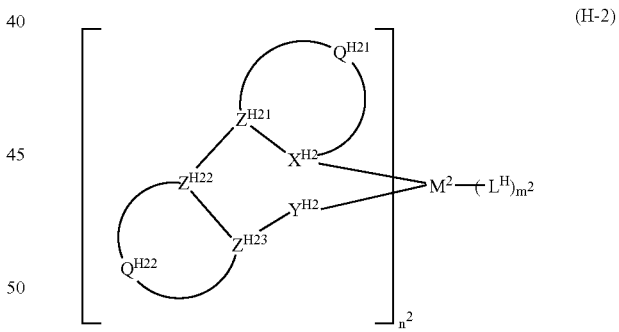

(H-2)

herein $X^{H2}$ represents an oxygen atom, a nitrogen atom, a sulfur atom or a carbon atom, which may have a substituent if possible; $Y^{H2}$ represents an oxygen atom, a nitrogen atom or a sulfur atom, which may have a substituent if possible; $Z^{H21}$, $Z^{H22}$ and $Z^{H23}$ each represent a carbon atom or a nitrogen atom, which may have a substituent if possible; $Q^{H21}$ and $Q^{H22}$ represent a group of atoms necessary to form a 5- or 5-membered ring; $M^2$ represents a metal ion; $n^2$ represents an integer of 1 or more; $L^H$ represents a ligand; and $m^2$ represents an integer of 0 or more. The type of the bonds between the individual atoms in the formula may be a single bond, a double bond, a triple bond or a coordinate bond;

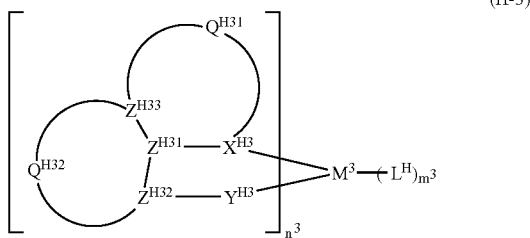

(H-3)

wherein $X^{H3}$ represents an oxygen atom, a nitrogen atom, a sulfur atom or a carbon atom, which may have a substituent if possible; $Y^{H3}$ represents an oxygen atom, a nitrogen atom, or a sulfur atom, which may have a substituent if possible; $Z^{H31}$, $Z^{H32}$ and $Z^{H33}$ each represent a carbon atom or a nitrogen atom, which may have a substituent if possible; $Q^{H31}$ and $Q^{H32}$ represent a group of atoms necessary to form a 5- or 6-membered ring; $M^3$ represents a metal ion; $n^3$ represents an integer of 1 or more; $L^3$ represents a ligand; $m^3$ represents an integer of 0 or more; and the type of the bonds between the individual atoms in the formula may be a single bond, a double bond, a triple bond or a coordination bond.

(11) The organic electroluminescent element as described in any one of the above (1) to (10), wherein the metal complex functioning as a host material is that represented by the following formula (H-4):

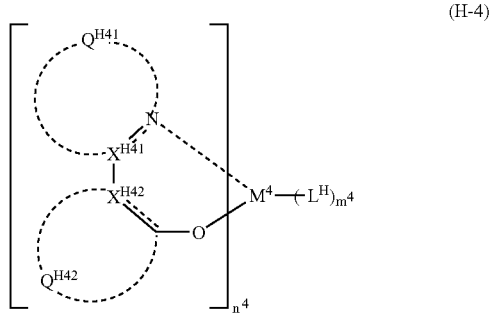

(H-4)

wherein $X^{H41}$ and $X^{H42}$ each represents a carbon atom or a nitrogen atom; the bond between $X^{H41}$ and the nitrogen atom, and that between $X^{H42}$ and the carbon atom each represent a single or double bond; $Q^{H41}$ and $Q^{H42}$ each represent a group of atoms necessary to form a 5-or 6-membered ring; $M^4$ represents a metal ion; $n^4$ represents an integer of 1 or more; $L^H$ represents a ligand; and $m^4$ represents an integer of 0 or more.

(12) The organic electroluminescent element as described in any one of the above (1) to (11), wherein the metal complex functioning as a host material is that represented by the following formula (H-5):

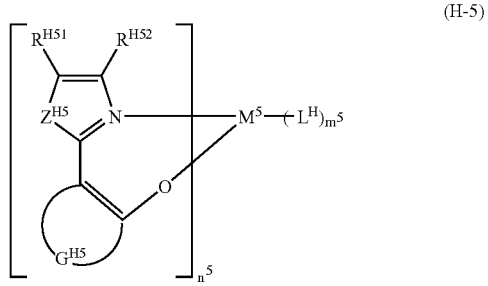

(H-5)

wherein $R^{H51}$ and $R^{H52}$ each represent a hydrogen atom or a substituent; $Z^{H5}$ represents an oxygen atom, a sulfur atom, —$C(R^{H53})R^{H54}$—, or —$NR^{H55}$—; $R^{H53}$, $R^{H54}$ and $R^{H55}$ each represent a hydrogen atom or a substituent; $Q^{H5}$ represents a group of atoms necessary to form a 5- or 6-membered ring; $M^5$ represents a metal ion; $n^5$ represents an integer of 1 or more; $L^H$ represents a ligand; and $m^5$ represents an integer of 0 or more. The type of the bonds between the individual atoms in the formula may be a single bond, a double bond, a triple bond or a coordinate bond.

(13) The organic electroluminescent element as described in any one of the above (1) to (12), wherein the metal complex functioning as a host material is that represented by the following formula (H-6):

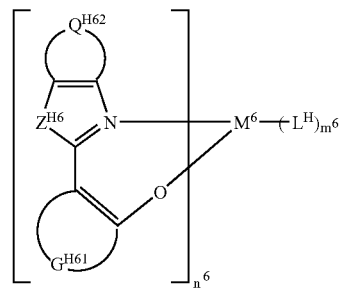

wherein $Z^{H6}$ represents an oxygen atom, a sulfur atom, —$C(R^{H63})R^{H64}$ or —$NR^{H65}$—; $R^{H63}$, $R^{H64}$ and $R^{H65}$ each represent a hydrogen atom or a substituent; $Q^{H61}$ represents a group of atoms necessary to form a hetero ring; $M^6$ represents a metal ion; $n^6$ represents an integer of 1 or more; $L^H$ represents a ligand; and $m^6$ represents an integer of 0 or more. The type of the bonds between the individual atoms in the formula may be a single bond, a double bond, a triple bond or a coordinate bond.

(14) The organic electroluminescent element as described in any one of the above (1) to (13), wherein the luminescent layer contains at least one phosphorescent material and at least two kinds of host materials.

DETAILED DESCRIPTION OF THE INVENTION

The organic EL element of the invention is described in more detail below. The light-emitting element of the invention is an organic electroluminescent element having an organic layer including at least both a light-emitting layer and an electron transporting layer between a pair of electrodes, wherein the light-emitting layer contains at least one phosphorescence-emitting material and at least one metal complex functioning as a host material, and the electron transporting layer contains a compound functioning as an electron transporting material and represented by the formula (E-I). Also, a hole injecting layer, a hole transporting layer, an electgron injecting layer, a protective layer, etc. may be provided between a pair of the electrodes in addition to the light-emitting layer and the electron transporting layer. Each of these layers may exert other function than that its name indicates. In the invention, the compound represented by the formula (E-I) is contained in the electron transporting layer and functions preferably as an electron transporting material.

The metal complex (metal complex of the invention) functioning as a host material functions as a host material and, among the materials to be contained in the light-emitting layer, is a material other than the phosphorescence-emitting material (phosphorescence material) and means a material which has at least one of the following various functions (various functions described hereinbefore):

- a function of dispersing the light-emitting material (in the invention, phosphorescence-emitting material) to retain it in the layer;
- a function of receiving holes from an anode or a hole transporting layer;
- a function of receiving electrons from a cathode or an electron transporting layer;
- a function of transporting holes and/or electrons;
- a function of providing a site for recombination of a hole and an electron;
- a function of transporting an energy of exciton generated by the recombination to a light-emitting material; and
- a function of transporting holes and/or electrons to a light-emitting material.

Materials having at least one of the function of transporting holes and/or electrons and the function of transporting an energy of exciton generated by the recombination to a light-emitting material among the above-described various functions are preferred, and materials having at least two of the functions are more preferred. Further, the metal complex of the invention may further have other functions described above than the function of transporting holes and/or electrons and the function of transporting an energy of exciton generated by the recombination to a light-emitting material.

In order to function as a host material, the metal complex of the invention is preferably a major component in the light-emitting layer. The content of the metal complex of the invention in the light-emitting layer is preferably from 50% by weight to 99.9% by weight, more preferably from 60% by weight to 99% by weight.

As the metal complex of the invention to be used as a host material, those which are extremely stable against electrochemical oxidation and reduction are preferred so as to be electrochemically oxidized or reduced upon exerting the above-described function. In other words, those oxidized species (e.g., radical cation species) and reduced species (e.g., radical anion species) of which are extremely stable are preferred.

Also, in the case where the recombination is conducted in the metal complex of the invention, an exciton of the host material is first generated, and hence it is preferred for the excited state of the metal complex of the invention to be stable without causing decomposition or thermal inactivation. This also means that the metal complex of the invention is preferably stable against light.

Since breakage of a membrane or decomposition of a material due to heat generated during driving is a large factor of deterioration of the organic EL elements, the metal complex of the invention is preferably a material which does not undergo decomposition due to heat and which can retain a stable amorphous film state up to an elevated temperature.

However, even when a material showing a high performance and a high durability is used as a host material, a technique of using an electron transporting material with a poor performance or providing a hole blocking layer to increase recombination ratio can cause deterioration of the characteristic properties or durability of the element.

The inventors have found that the above-described problems can be solved by using a metal complex as a host material and using a compound with a specific structure as an electron transporting material. In particular, it has been found that light-emitting ability of an organic EL element can be further improved by using a metal complex having a specific structure. Also, the inventors have found that the above-described problems can be solved by a phosphorescence-emitting organic EL element using a metal complex with a special structure as a host material and not having a hole-blocking layer.

In consideration of durability of light-emitting elements, the metal complex of the invention has a glass transition temperature (Tg) of preferably from 130° C. to 400° C., more preferably from 135° C. to 400° C., still more preferably from 140° C. to 400° C., particularly preferably from 150° C. to 400° C., most preferably from 160° C. to 400° C. Tg can be confirmed by thermal measurement such as differential scanning calorimetry (DSC) or differential thermal analysis (DTA), X-ray diffractiometry (XRD) or observation under a polarizing microscope.

The metal species of the metal complex of the invention is not particularly limited, but is preferably a metal of the second to fourth period in the periodic table, more preferably, Li, Be, Na, Mg, Al, K, Ca, Sc, Ti, V, Cr, Mn, Fe, Co, Ni, Cu, Zn, Ga or Ge, still more preferably Li, Be, Na, Mg, Al, Ti, Fe, Co, Ni, Cu, Zn or Ga, still more preferably Be, Mg, Al, Fe, Ni, Cu, Zn or Ga, still more preferably Be, Mg, Al, Cu, Zn or Ga particularly preferably Al, Zn or Ga.

The metal complex of the invention may be a so-called binuclear complex having a plurality of metal ions within the same molecule. Also, it may be a binuclear complex containing plural kinds of metals. Further, it may have plural kinds of ligands. The metal complex of the invention is preferably a neutral metal complex.

The metal complex of the present invention is preferably a chelate complex having a ligand with two or more positions, and more preferably a metal complex represented by the following formula (H-1). In formula (H-1), $X^{H1}$ represents an oxygen atom, a nitrogen atom, a sulfur atom, a carbon atom or a phosphorus atom, which may have a substituent if possible or may be an atom constituting another ring. $Y^{H1}$ represents an oxygen atom, a nitrogen atom, a sulfur atom, a carbon atom or a phosphorus atom, which may have a substituent if possible or may be an atom constituting another ring; $M^1$ represents a metal ion; $n^1$ represents an integer of 1 or more; $L^H$ represents a ligand; $m$ represents an integer of 0 or more; $Q^{H1}$ represents a group of atoms forming a chelate ring together with $X^{H1}$, $Y^{H1}$, and $M^1$; and the type of the bonds between the individual atoms in the formula may be a single bond, a double bond, a triple bond or a coordinate bond.

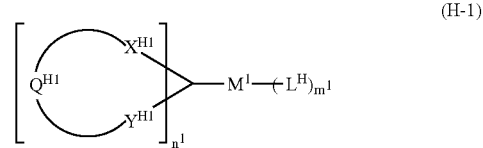

(H-1)

The metal complex represented by formula (H-1) is now described in detail. $X^{H1}$ represents an oxygen atom, a nitrogen atom, a sulfur atom, a carbon atom or a phosphorus atom, which may have a substituent if possible or may be an atom constituting another ring. $X^{H1}$ is preferably an oxygen atom, anitrogen atom or a sulfur atom, and more preferably a nitrogen atom. In the case where $X^1$ has a substituent, the substituent is, for example, an alkyl group (Preferably one with 1 to 20 carbon atoms, more preferably one with 1 to 12 carbon atoms, and particularly preferably one with 1 to 8 carbon atoms such as, for example, methyl, ethyl, isopropyl, tert-butyl, n-octyl, n-decyl, n-hexadecyl, cyclopropyl, cyclopentyl, cyclohexyl, etc. are mentioned.), an alkenyl group (Preferably one with 2 to 20 carbon atoms, more preferably one with 2 to 12 carbon atoms, and particularly preferably one with 2 to 8 carbon atoms such as, for example, vinyl, allyl, 2-butenyl, 3-pentenyl, etc. are mentioned.), an alkynyl group (Preferably one with 2 to 20 carbon atoms, more preferably one with 2 to 12 carbon atoms, and particularly preferably one with 2 to 8 carbon atoms such as, for example, propargyl, 3-pentynyl, etc. are mentioned.), an aryl group (Preferably one with 6 to 30 carbon atoms, more preferably one with 6 to 20 carbon atoms, and particularly preferably one with 6 to 12 carbon atoms such as, for example, phenyl, p-methylphenyl, naphthyl, etc. are mentioned.), a substituted carbonyl group (Preferably one with 1 to 20 carbon atoms, more preferably with 1 to 16 carbon atoms, and particularly preferably one with 1 to 12 carbon atoms such as, for example, acetyl, benzoyl, methoxycarbonyl, phenyloxycarbonyl, dimethylaminocarbonyl, phenylaminocarbonyl, etc. are mentioned.), a substituted sulfonyl group (Preferably one with 1 to 20 carbon atoms, more preferably one with 1 to 16 carbon atoms, and particularly preferably one with 1 to 12 carbon atoms such as, for example, mesyl, tosyl, etc. are mentioned.), a heterocyclic ring (An aliphatic heterocyclic group or an aromatic heterocyclic group are included, preferably containing one of an oxygen atom, a sulfur atom or a nitrogen atom and preferably 1 to 5 carbon atoms, more preferably 1 to 30 carbon atoms, and particularly preferably 2 to 12 carbon atoms, exemplified by imidazolyl, pyridyl, furyl, piperidyl, morpholino, benzoxazolyl, triazolyl, etc.). These groups may be further substituted.

In the case where $X^{H1}$ is an atom constituting another ring, such other ring includes a benzene ring, a pyridine ring, a pyrazine ring, a pyrimidine ring, a pyridazine ring, a triazine ring, a pyrrole ring, a thiophene ring, a furan ring, an oxazole ring, an isoxazole ring, a thiazole ring, an isothiazole ring, an imidazole ring, a pyrazole ring, a triazole ring, an oxadiazole ring, a thiadiazole ring, a tetrazole ring, or an aromatic ring which has been reduced completely or partially, etc. These rings may be condensed with another ring, or may have a substituent. As the substituent, those mentioned as the one for the foregoing $X^1$ are applied.

$Y^{H1}$ represents an oxygen atom, a nitrogen atom, a sulfur atom, a carbon atom or a phosphorus atom, which may have a substituent if possible or may be an atom constituting another ring. $Y^{H1}$ is preferably an oxygen atom, a nitrogen atom, a sulfur atom or a carbon atom, more preferably an oxygen atom or a nitrogen atom, and still more preferably an oxygen atom. When $Y^{H1}$ has a substituent, those mentioned as the one for the foregoing $X^{H1}$ are applied as the substituent.

$Q^{H1}$ represents a group of atoms forming a ring together with $X^{H1}$, $M^1$ and $Y^{H1}$. The ring comprising $Q^{H1}$, $X^{H1}$, $M^1$ and $Y^{H1}$ is preferably a 5- or 6-membered one. $Q^{H1}$ may have a substituent whereby the substituent is, for example, preferably an alkyl group (Preferably one with 1 to 20 carbon atoms, more preferably one with 1 to 12 carbon atoms, and particularly preferably one with 1 to 8 carbon atoms such as, for example, methyl, ethyl, isopropyl, tert-butyl, n-octyl, n-decyl, n-hexadecyl, cyclopropyl, cyclopentyl, cyclohexyl, etc. are mentioned.), an alkenyl group (Preferably one with 2 to 20 carbon atoms, more preferably one with 2 to 12 carbon atoms, and particularly preferably one with 2 to 8 carbon atoms such as, for example, vinyl, 2-butenyl, 3-pentenyl, etc. are mentioned.), an alkynyl group (Preferably one with 2 to 20 carbon atoms, more preferably one with 2 to 12 carbon atoms, and particularly preferably one with 2 to 8 carbon atoms such as, for example, propargyl, 3-pentynyl, etc. are mentioned.), an aryl group (Preferably one with 6 to 30 carbon atoms, more preferably one with 6 to 20 carbon atoms, and particularly preferably one with 6 to 12 carbon atoms such as, for example, phenyl, p-methylphenyl, naphthyl, etc. are mentioned.), a substituted carbonyl group (Preferably one with 1 to 20 carbon atoms, more preferably one with 1 to 16 carbon atoms, and particularly preferably one with 1 to 12 carbon atoms such as, for example, acetyl, benzoyl, methoxycarbonyl, phenyloxycarbonyl, dimethylaminocarbonyl, phenylaminocarbonyl, etc. are mentioned.), an amino group (Preferably one with 1 to 20 carbon atoms, more preferably one with 1 to 16 carbon atoms, and particularly preferably one with 1 to 12 carbon atoms such as, for example, dimethylamino, methylcarbonylamino, ethylsulfonylamino, dimethylaminocarbonylamino, phthalimide, etc. are mentioned.), a sulfonyl group (Preferably one with 1 to 20 carbon atoms, more preferably one with 1 to 16 carbon atoms, and particularly preferably one with 1 to 12 carbon atoms such as, for example, mesyl, tosyl, etc. are mentioned.), a sulfo group, a carboxyl group, a heterocyclic group (An aliphatic heterocyclic group and an aromatic heterocyclic group are mentioned; preferably such groups contain one of an oxygen atom, a sulfur atom and a nitrogen atom, and have preferably 1 to 50 carbon atoms, more preferably 1 to 30 carbon atoms, and particularly preferably 2 to 12 carbon atoms. Examples include imidazolyl, pyridyl, furyl, piperidyl, morpholino, benzoxazolyl, triazolyl, etc.), a hydroxy group or an alkoxy group (Preferably 1 to 20 carbon atoms, more preferably with 1 to 16 carbon atoms, and particularly preferably one with 1 to 12 carbon atoms such as, for example, methoxy, benzyloxy, etc. are mentioned.), an aryloxy group (Preferably one with 6 to 20 carbon atoms, more preferably one with 6 to 16 carbon atoms, and particularly preferably one with 6 to 12 carbon atoms such as, for example, phenoxy, naphthyloxy, etc. are mentioned.), a halogen atom (preferably a fluorine atom, a chlorine atom, a bromine atom or an iodine atom), a thiol group, an alkylthio group (Preferably one with 1 to 20 carbon atoms, more preferably one with 1 to 16 carbon atoms, and particularly preferably one with 1 to 12 carbon atoms such as, for example, methylthio group, etc. are mentioned.), an arylthio group (Preferably one with 6 to 20 carbon atoms, more preferably one with 6 to 16 carbon atoms, and particularly preferably one with 6 to 12 carbon atoms such as, for example, phenylthio, etc. are mentioned.), a cyano group or a silyl group (Preferably one with 0 to 40 carbon atoms, more preferably one with 3 to 30 carbon atoms, and particularly preferably one with 3 to 18 carbon atoms such as, for example, trimethylsilyl, triphenylsilyl, t-butyldiphenylsilyl, etc. are mentioned.), etc. These groups may be further substituted.

$M^1$ represents a metal ion. The metal ion, on which no restriction exists, is preferably the one belonging to the second to sixth periods of the periodic table (the long period type), more preferably a divalent or trivalent metal ion, still more preferably $Be^{2+}$, $Mg^{2+}$, $Al^{3+}$, $Cu^{2+}$, $Zn^{2+}$, $Ga^{3+}$, $Pd^{2+}$, $In^{3+}$, $Ir^{3+}$ and $Pt^{2+}$, and most preferably $Al^{3+}$, $Zn^{2+}$ and $Ga^{3+}$.

$L^H$ represents a ligand with a single or multiple positions. The ligand includes, for example, a halogen ion (For example, $Cl^-$, $Br^-$, $I^-$, etc. are mentioned.), perchlorate ion, an alkoxy ion (Preferably one with 1 to 20 carbon atoms, more preferably one with 1 to 10, and more preferably one with 1 to 5 carbon atoms such as, for example, methoxy ion, ethoxy ion, isopropoxy ion, acetylacetonate ion, etc. are mentioned.), an aryloxy ion (Preferably one with 6 to 20 carbon atoms, more preferably one with 6 to 12 carbon atoms, and particularly preferably one with 6 to 8 carbon atoms such as, for example, phenoxy ion, quinolinol ion, 2-(2-hydroxyphenyl)benzazole ion, etc. are mentioned.) a nitrogen-containing hetero ring (Preferably one with 1 to 20 carbon atoms, more preferably one with 2 to 10 carbon atoms, and still more preferably one with 3 to 8 carbon atoms such as phenathlene, bipyridyl, etc. are mentioned.), an acyloxy ion (Preferably one with 1 to 20 carbon atoms, more preferably one with 2 to 10 carbon atoms, and still more preferably one with 3 to 8 carbon atoms such as acetoxy ion, etc. are mentioned.), a silyloxy ion (Preferably one with 3 to 50 carbon atoms, more preferably one with 3 to 40 carbon atoms, and still more preferably one with 3 to 25 carbon atoms such as triphenylsilyloxy ion, etc. are mentioned.), an ether compound (Preferably one with 2 to 20 carbon atoms, more preferably one with 3 to 10 carbon atoms, and still more preferably one with 3 to 8 carbon atoms such as tetrahydrofuran, etc. are mentioned.), hydroxy ion, etc. More preferably, the ligand is an alkoxy ion, silyloxy ion or an aryloxy ion, more preferably silyloxy ion or an aryloxy ion, and particularly preferably an aryloxy ion.

$n^1$ represents an integer of 1 or more, and $m^1$ represents an integer of o or more. With regard to the preferable ranges for $n^1$ and $m^1$, which depend on the kind of the metal ion and are not particularly restricted, $n^1$ is preferably 1 to 4, more preferably 1 to 3, and particularly preferably 2 or 3, and $m^1$ is preferably 0 to 2, more preferably 0 or 1, and particularly preferably 0. Preferable combinations of $n^1$ and $m^1$ are such that the metal complex represented by formula (H-1) becomes neutral.

In formula (H-1), all the bonds between the individual atoms are expressed by single solid lines, which, however, do not indicate that the bond is a single bond. Correctly, the type of bonding between the individual atoms is not restricted.

The metal complex represented by formula (H-1) is more preferably represented by the following formula (H-2) or (H-3).

In formula (H-2), $X^{H2}$ represents an oxygen atom, a nitrogen atom, a sulfur atom or a carbon atom, which may have a substituent if possible whereby, as the substituent, those mentioned as the substituent for $X^{H1}$ in formula (H-1) can be applied. $X^{H2}$ preferably represents a nitrogen atom. $Y^{H2}$ preferably represents n oxygen atom, a nitrogen atom or a sulfur atom which may have a substituent if possible whereby, as the substituent, those mentioned as the substituent for $X^{H1}$ in formula (H-1) can be applied. $Y^{H2}$ preferably represents an oxygen atom, a sulfur atom, or a substituted or unsubstituted nitrogen atom, more preferably an oxygen atom or a substituted nitrogen atom, and still more preferably an oxygen atom. $Z^{H21}$, $Z^{H22}$ and $Z^{H23}$ each represent a carbon atom or a nitrogen atom. $Z^{H21}$, $Z^{H22}$ and $Z^{H23}$ each preferably represent a carbon atom.

$Q^{H21}$ represents a group of atoms necessary to form a ring via bonding to $X^{H2}$ and $Z^{H21}$. The ring formed with $Q^{H21}$ is preferably a 5- or 6-membered one, more preferably an aromatic 5-membered or aromatic 6-membered one, still more preferably a nitrogen-containing aromatic 5-membered hetero ring or a nitrogen-containing aromatic 6-membered heterocycle, and most preferably a nitrogen-containing aromatic 6-membered hetero ring.

Specific examples of the ring formed with $Q^{H21}$ include a benzene ring, a pyridine ring, a pyrazine ring, a pyrimidine ring, a pyridazine ring, a triazine ring, a pyrrole ring, a thiophene ring, a furan ring, an oxazole ring, an isoxazole ring, a thiazole ring, an isothiazole ring, an imidazole ring, a pyrazole ring, a triazole ring, an oxadiazole ring, a thiadiazole ring, a tetrazole ring, or an aromatic ring the total sites or part of which are reduced, etc. Preferably, the ring is a pyridine ring, a pyrimidine ring, a pyridazine ring, a pyrazine ring, an oxazole ring and an imidazole ring, more preferably a pyridine ring, a pyrazine ring, an oxazole ring and an imidazole ring, and still more preferably an imidazole ring. The ring formed with $Q^{H21}$ may be further condensed with another ring to form a condensed ring, and may have a substituent. As the substituent, those mentioned as the substituent for $Q^{H1}$ in formula (H-1) can be applied.

$Q^{H22}$ represents a group of atoms necessary to form a ring via bonding to $Z^{H22}$ and $Z^{H23}$. The ring formed with $Q^{H22}$ are preferably 5- or 6-membered one, and more preferably aromatic 5- or 6-membered one.

Specific examples of the ring formed with $Q^{H22}$ include a cyclopentene ring, a cyclohexene ring, a benzene ring, a naphthalene ring, an anthracene ring, a phenanthrene ring, a pyrene ring, a perylene ring, a pyridine ring, a quinoline ring, a furan ring, a thiophene ring, a pyrazine ring, a pyrimidine ring, a thiazole ring, a benzothiazole ring, a naphthothiazole ring, an oxazole ring, a benzoxazole ring, a naphthoxazole ring, an isoxazole ring, an imidazole ring, a benzimidazole ring, an isoquinoline ring, a pyrazole ring and a triazole ring. Among these, more preferable rings are a naphthalene ring and a benzene ring, and still more preferable one is a benzene ring. The ring formed with $Q^{H22}$ may be further condensed with another ring to form a condensed ring, and may have a substituent. As the substituent, those mentioned as the substituent for $Q^{H1}$ in formula (H-1) can be applied.

$M^2$, $n^2$ and $m^2$ each have the same meaning as $M^1$, $n^1$ and $m^1$, respectively, and the preferable ranges thereof are also the same.

In formula (H-2), all the bonds between the individual atoms are expressed by single solid lines, which, however, do not indicate that the bond is a single bond. Correctly, the type of bonding between the individual atoms is not restricted.

In formula (H-3), $X^{H3}$ represents an oxygen atom, anitrogen atom, a sulfur atom or a carbon atom, which may have a substituent if possible whereby, as the substituent, those mentioned as the substituent for $X^{H1}$ in formula (H-1) can be applied. $X^{H3}$ preferably represents an oxygen atom, a sulfur atom or a nitrogen atom, and more preferably a nitrogen atom. $Y^{H3}$ represents an oxygen atom, a nitrogen atom or a sulfur atom which may have a substituent if possible whereby, as the substituent, those mentioned as the substituent for $X^{H1}$ in formula (I) can be applied. $Y^{H3}$ preferably represents an oxygen atom, a sulfur atom, or a substituted or unsubstituted nitrogen atom, more preferably an oxygen atom or a substituted nitrogen atom, and still more preferably an oxygen atom. $Z^{H31}$, $Z^{H32}$ and $Z^{H33}$ each represent a carbon atom or a nitrogen atom which may have a substituent if possible. $Z^{H31}$, $Z^{H32}$ and $Z^{H33}$ each preferably represent a carbon atom.

$Q^{H31}$ represents a group of atoms necessary to form a ring via bonding to $X^{H3}$ and $Z^{H33}$. The ring formed with $Q^{H31}$ is preferably a 5- or 6-membered one, more preferably an aromatic 5-membered or aromatic 6-membered one, still more preferably a nitrogen-containing aromatic 5-membered hetero ring or a nitrogen-containing aromatic 6-membered hetero ring, and most preferably a nitrogen-containing aromatic 6-membered hetero ring.

Specific examples of the ring formed with $Q^{H31}$ include a benzene ring, a pyridine ring, a pyrazine ring, a pyrimidine ring, a pyridazine ring, a triazine ring, a pyrrole ring, a thiophene ring, a furan ring, an oxazole ring, an isoxazole ring, a thiazole ring, an isothiazole ring, an imidazole ring, a pyrazole ring, a triazole ring, an oxadiazole ring, a thiadiazole ring, a tetrazole ring, or an aromatic ring the total sites or part of which are reduced, etc. Preferably, the ring is a pyridine ring, a pyrimidine ring, a pyridazine ring or a pyrazine ring, more preferably a pyridine ring or pyrazine ring, and still more preferably a pyridine ring. The ring formed with $Q^{H31}$ may be further condensed with another ring to form a condensed ring, and may have a substituent. As the substituent, those mentioned as the one for $Q^{H1}$ in formula (H-1) can be applied.

$Q^{H32}$ represents a group of atoms necessary to form a ring via bonding to $Z^{H32}$ and $Z^{H33}$. The ring formed with $Q^{H32}$ is preferably a 5- or 6-membered one, and more preferably an aromatic 5-membered or aromatic 6-membered one.

Specific examples of the ring formed with $Q^{H31}$ include a benzene ring, a pyridine ring, a pyrazine ring, a pyrimidine ring, a pyridazine ring, a triazine ring, a pyrrole ring, a thiophene ring, a furan ring, an oxazole ring, an isoxazole ring, a thiazole ring, an isothiazole ring, an imidazole ring, a pyrazole ring, a triazole ring, an oxadiazole ring, a thiadiazole ring, a tetrazole ring, or the aforementioned aromatic ring which is reduced completely or partially, etc. Preferably, the ring is a benzene ring or a pyridine ring, and more preferably a benzen ring. The ring formed with $Q^{H21}$ may be further condensed with another ring to form a condensed ring, or may have a substituent. As the substituent, those mentioned as the one for $Q^{H1}$ in formula (H-1) can be applied.

$M^3$, $n^3$ and $m^3$ each have the same meaning as $M^1$, $n^1$ and $m^1$, respectively, and the preferable ranges thereof are also the same.

In formula (H-3), the bond between the individual atoms is always expressed by a single solid line, which, however, does not indicate that the bond is a single bond. Correctly, the type of bonding between the individual atoms is not restricted.

More preferable metal complexes among those represented by formula (H-2) are represented by formula (H-4). In formula (H-4), $X^{41}$ and $X^{42}$ each represent a carbon atom or a nitrogen atom; the bonds between $X^{41}$ and the nitrogen atom and between $X^{42}$ and the carbon atom may be a single bond or a double bond; $Z^{41}$ and $Z^{42}$ each represent a group of atoms necessary to form a 5- or 6-membered ring; $M^4$ represents a metal ion; $n^4$ represents an integer of 1 or more; $L^H$ represents a ligand; and $m^4$ represents an integer of 0 or more.

In formula (H-4), the bonds between $X^{41}$ and the nitrogen atom and between $X^{42}$ and the carbon atom are expressed by dual lines, one being solid and the other dotted, which indicate that the bond may be either a single or a double bond.

$Z^{41}$ represents a group of atoms necessary to form a 5- or 6-membered ring containing $X^{41}$ and the nitrogen atom. The ring containing $Z^{41}$ may have a substituent which includes the following group A of substituent.

(Substituent Group A)

An alkyl group (containing preferably from 1 to 20 carbon atoms, more preferably from 1 to 12 carbon atoms, particularly preferably from 1 to 8 carbon atoms; e.g., methyl, ethyl, iso-propyl, tert-butyl, n-octyl, n-decyl, n-hexadecyl, cyclopropyl, cyclopentyl or cyclohexyl), an alkenyl group (containing preferably from 2 to 20 carbon atoms, more preferably from 2 to 12 carbon atoms, particularly preferably from 2 to 8 carbon atoms; e.g., vinyl, allyl, 2-butenyl or 3-pentenyl), an alkynyl group (containing preferably from 2 to 20 carbon atoms, more preferably from 2 to 12 carbon atoms, particularly preferably from 2 to 8 carbon atoms; e.g., propargyl or 3-pentynyl), an aryl group (containing preferably from 6 to 30 carbon atoms, more preferably from 6 to 20 carbon atoms, particularly preferably from 6 to 12 carbon atoms; e.g., phenyl, p-methylphenyl or naphthyl), a substituted carbonyl group (containing preferably from 1 to 20 carbon atoms, more preferably from 1 to 16 carbon atoms, particularly preferably containing from 1 to 12 carbon atoms; e.g., mesyl or tosyl), a sulfo group, a carboxyl group, a heterocyclic group (including an aliphatic heterocyclic group and an aromatic heterocyclic group, containing preferably one of an oxygen atom, a sulfur atom and a nitrogen atom, and containing preferably from 1 to 50 carbon atoms, more preferably from 1 to 30 carbon atoms, particularly preferably from 2 to 12 carbon atoms; e.g., imidazolyl, pyridyl, furyl, piperidyl, morpholino, benzoxazolyl or triazolyl), a hydroxyl group, an alkoxy group (containing preferably from 1 to 20 carbon atoms, more preferably from 1 to 16 carbon atoms, particularly preferably from 1 to 12 carbon atoms; e.g., methoxy or benzyloxy), an aryloxy group (containing preferably from 6 to 20 carbon atoms, more preferably from 6 to 16 carbon atoms, particularly preferably from 6 to 12 carbon atoms; e.g., phenoxy or naphthyloxy), a halogen atom (preferably a fluorine atom, a chlorine atom, a bromine atom or an iodine atom), a thiol group, an alkylthio group (containing preferably from 1 to 20 carbon atoms, more preferably from 1 to 16 carbon atoms, particularly preferably from 1 to 12 carbon atoms; e.g., methylthio), an arylthio group (containing preferably from 6 to 20 carbon atoms, more preferably from 6 to 16 carbon atoms, particularly preferably from 6 to 12 carbon atoms; e.g., phenylthio), a cyano group, a silyl group (containing preferably from 0 to 40 carbon atoms, more preferably from 3 to 30 carbon atoms, particularly preferably from 3 to 18 carbon atoms; e.g., trimethylsilyl, triphenylsilyl or t-butyldiphenylsilyl), etc. are illustrated. These substituents may further be substituted. Also, the ring containing $Q^{H41}$ may form a condensed ring together with other ring.

Examples of the ring containing $Q^{H41}$ include a pyridine ring, a pyrimidine ring, a pyridazine ring, a pyrazine ring, a quinoline ring, a quinoxaline ring, an isoquinoline ring, a cinnoline ring, a phthalazine ring, a quinazoline ring, a triazine ring, an acridine ring, a phenazine ring, a phenanthroline ring, a pyrrole ring, an indole ring, a pyrazole ring, an imidazole ring, a benzimidazole ring, an oxazole ring, a benzoxazole ring, a thiazole ring, a benzothiazole ring, a selenazole ring, a benzoselenazole ring, an indazole ring, an isothiazole ring, an isoxazole ring, a triazole ring, a benzotriazole ring, a tetrazole ring, an oxadiazole ring, a thiadiazole ring, a thiatriazole ring, azaindole ring, an imidazopyridine ring, a purine ring and an imidazoline ring. More preferred examples thereof include a pyridine ring, a pyrimidine ring, a pyrazine ring, a quinoline ring, a quinoxaline ring, an isoquinoline ring, a phthalazine ring, a pyrrole ring, an indole ring, an imidazole ring, a benzimidazole ring, an oxazole ring, a benzoxazole ring, a thiazole ring, a benzothiazole ring, a triazole ring, a benzotriazole ring and an imidazopyridine ring, with an imidazopyridine ring being still more preferred.

$Q^{H42}$ represents atoms necessary for forming a 5- or 6-membered ring together with $X^{H42}$ and the carbon atom (carbon atom connected to the oxygen atom in the formula).

The ring containing $Q^{H42}$ may have a substituent and, as the substituent, those which have been illustrated as substituents for the ring containing $Q^{H41}$ may be employed, with preferred substituents being the same as described there.

Examples of the ring containing $Q^{H42}$ include cyclopentene, cyclohexene, benzene, naphthalene, anthracene, phenanthrene, pyrene, perylene, pyridine, quinoline, furan, thiophene, pyrazine, pyrimidine, thiazole, benzothiazole, naphthothiazole, oxazole, benzoxazole, naphthoxazole, isoxazole, selenazole, benzoselenazole, naphthoselenazole, imidazole, benzimidazole, naphthimidazole, isoquinoline, pyrazole and triazole. The ring containing $Q^{H42}$ is preferably an aromatic ring. For example, the ring is preferably benzene, naphthalene, anthracene, pyridine, thiophene, pyrazine or pyrimidine, more preferably benzene or naphthalene, still more preferably benzene. The substituent on $Q^{H41}$ and the substituent on $Q^{H42}$ may be connected to each other to form a ring.

$M^4$, $n^4$ and $m^4$ each have the same meaning as $M^1$, $n^1$ and $m^1$, respectively, and the preferable ranges thereof are also the same.

The metal complexes represented by formula (H-4) are more preferablly those represented by formula (H-5). In formula (H-5), $R^{H51}$ and $R^{H52}$ each represent a hydrogen atom or a substituent. As the substituent, for example, those mentioned as the substituent for $Q^{H1}$ in formula (H-1) can be applied. $R^{H51}$ and $R^{H52}$ may be bonded together to form a ring. The ring resulting from the bonding of $R^{H51}$ and $R^{H52}$ includes a cycloalkene ring, a benzene ring, a hetero ring (For example, pyridine ring, pyrazine ring, pyrimidine ring, pyridazine ring, triazine ring, pyrrol ring, thiophene ring, furan ring, oxazole ring, isoxazole ring, thiazole ring, isothiazole ring, imidazole ring, pyrazole ring, triazole ring, oxadiazole ring, thiadiazole ring, tetrazole ring, etc. are mentioned.), etc. These rings may further be condensed with another ring, and may further have a substituent.

As $R^{H51}$ and $R^{H52}$, a hydrogen atom, an alkyl group, an aryl group, an aromatic hetero ring, and an aromatic ring resulting from their mutual bonding are preferred; a hydrogen atom, an alkyl group, an aryl group, and such groups that form an aromatic hetero ring upon mutual bonding are more preferred, and a hydrogen atom, an aryl group and such groups that form an aromatic hetero ring upon mutual bonding are still more preferred.

$Z^{H5}$ represents an oxygen atom, a sulfur atom or —C($R^{H53}$)$R^{H54}$— or —N$R^{H55}$—; $R^{H53}$ and $R^{H54}$ each represent a hydrogen atom or a substituent whereby, as the substituent, those mentioned as those for $X^{H1}$ in formula (H-1) can be applied. $R^{H55}$ represents a hydrogen atom or a substituent whereby the substituent of $R^{H55}$ includes, for example, an alkyl group (Preferably one with 1 to 20 carbon atoms, more preferably one with 1 to 12 carbon atoms, and particularly preferably one with 1 to 8 carbon atoms such as, for example, methyl, ethyl, isopropyl, tert-butyl, n-octyl, n-decyl, n-hexadecyl, cyclopropyl, cyclopentyl, cyclohexyl, etc. are mentioned.), an alkenyl group (Preferably one with 2 to 20 carbon atoms, more preferably one with 2 to 12 carbon atoms, and particularly preferably one with 2 to 8 carbon atoms such as, for example, vinyl, allyl, 2-butenyl, 3-pentenyl, etc. are mentioned.), an alkynyl group (Preferably one with 2 to 20 carbon atoms, more preferably one with 2 to 12 carbon atoms, and particularly preferably one with 2 to 8 carbon atoms such as, for example, propargyl, 3-pentynyl, etc. are mentioned.), an aryl group (Preferably one with 6 to 30 carbon atoms, more preferably one with 6 to 20 carbon atoms, and particularly preferably one with 6 to 12 carbon atoms such as, for example, phenyl, p-methylphenyl, naphthyl, etc. are mentioned.), a substituted carbonyl group (Preferably one with 1 to 20 carbon atoms, more preferably with 1 to 16 carbon atoms, and particularly preferably one with 1 to 12 carbon atoms such as, for example, acetyl, benzoyl, methoxycarbonyl, phenyloxycarbonyl, dimethylaminocarbonyl, phenylaminocarbonyl, etc. are mentioned.), a substituted sulfonyl group (Preferably one with 1 to 20 carbon atoms, more preferably one with 1 to 16 carbon atoms, and particularly preferably one with 1 to 12 carbon atoms such as, for example, mesyl, tosyl, etc. are mentioned.), a heterocyclic group (An aliphatic heterocyclic group or an aromatic heterocyclic group preferably containing one of an oxygen atom, a sulfur atom or a nitrogen atom and preferably 1 to 5 carbon atoms, more preferably 1 to 30 carbon atoms, and particularly preferably 2 to 12 carbon atoms exemplified by imidazolyl, pyridyl, furyl, piperidyl, morpholino, benzoxazolyl, triazolyl, etc. are mentioned). These groups may be further substituted. Preferably $R^{H55}$ is an alkyl group, an aryl group or an aromatic heterocyclic group, and more preferably an alkyl group or an aryl group.

$Q^{H5}$ represents a group of atoms necessary to form a 5- or 6-membered ring. The ring containing $Q^{H5}$ may further have a substituent, or may be condensed with another ring to form a condensed ring. As the substituent, those mentioned as the substituent for $Q^{H1}$ in formula (H-1) can be applied.

As the above-mentioned ring containing $Q^{H5}$, for example, cyclopentene ring, cyclohexene ring, benzene ring, naphthalene ring, anthracene ring, phenanthrene ring, pyrene ring, perylene ring, pyridine ring, quinoline ring, furan ring, thiophene ring, pyrazine ring, pyrimidine ring, thiazole ring, benzothiazole ring, naphthothiazole ring, oxazole ring, benzoxazole ring, naphthoxazole ring, isoxazole ring, imidazole ring, benzimidazole ring, naphthimidazole ring, isoquinoline ring, pyrazole ring, triazole ring, etc. are mentioned. The ring containing $Q^{H5}$ is preferably an aromatic ring. Specifically, it is preferably benzene ring, naphthalene ring, anthracene ring, pyridine ring, thiophene ring, pyrazine ring or pyrimidine ring, more preferably a benzene ring or naphthalene ring, and still more preferably benzene ring.

$M^5$, $n^5$ and $m^5$ each have the same meaning as $M^1$, $n^1$ and $m^1$, respectively, and the preferable ranges thereof are also the same.

In formula (H-5), the bond between the individual atoms is always expressed by a single solid line, which, however, does not indicate that the bond is a single bond. Actually, the type of bonding between the individual atoms is not restricted.

The metal complex represented by formula (H-5) is more preferably the one represented by formula (H-6). In formula (H-6), $Z^{H6}$, $M^6$, $n^6$, $m^6$ and $Q^{H61}$ each have the same meaning as $Z^{H5}$, $M^5$, $n^5$, $m^5$ and $Q^{H5}$ in formula (H-5), respectively, and the preferable ranges thereof are also the same.

$Q^{H62}$ represents a group of atoms necessary to form a heterocyclic group (An aliphatic heterocycle and an aromatic heterocycle are included. Preferable hetero atoms are oxygen sulfur and nitrogen, and the number of carbon atoms is preferably 2 to 20, more preferably 3 to 15, and particularly preferably 4 to 10, including, for example, pyridine ring, pyrazine ring, pyrimidine ring, pyridazine ring, triazine ring, pyrrole ring, thiophene ring, furan ring, oxazole ring, isoxazole ring, thiazole ring, isothiazole ring, imidazole ring, pyrazole ring, triazole ring, oxadiazole ring, thiadiazole ring, tetrazole ring, etc.).), etc. The hetero ring formed with $Q^{H62}$ may have a substituent. The heterocycle formed with $Q^{H62}$ may have a substituent. As such substituent, those mentioned as the substituent for $Q^{H1}$ in formula (H-1) can be applied.

In formula (H-6), the bond between the individual atoms is always expressed by a single solid line, which, however, does not indicate that the bond is a single bond. Actually, the type of the bond between the individual atoms is not restricted.

As the metal complex of the present invention, there may preferably be utilized, for example, metal complexes of imidazopyridine derivatives described in JP-A-2000-302754, metal complexes of benzoxazole derivatives described in JP-A-8-301877, JP-A-8-306489, JP-A-9-279134, JP-A-7-133483, JP-A-2000-200684, JP-A-2000-252066, JP-A-2000-247972 and JP-A-2000-173777, metal complexes of oxazole derivatives described in JP-A-2000-302754 and JP-A-2000-252067, metal complexes of benzothiazole derivatives described in JP-A-8-113576, JP-A-2000-200684, JP-A-2000-247964, JP-A-10-45722 and JP-T-2000-515926, metal complexes of thiazole derivatives described in JP-A-2001-131162, JP-A-2000-302754 and JP-A-2000-252067, metal complexes of benzimidazole derivatives described in JP-A-2000-200684 and JP-A-10-265478, metal complexes of imidazole derivatives described in JP-A-2000-302754 and JP-A-2000-252067, metal complexes of benzotriazole derivatives and benzopyrazole derivatives described in JP-A-9-111234, metal complexes of hydroxyphenyl-substituted pyridine derivatives described in JP-A-2000-357588 and JP-A-9-176629, metal complexes of hydroxyl-substituted benzoquinoline derivatives described in JP-A-9-20886 and JP-A-2000-12222, metal complexes of hydroxyl-substituted pyridoquinoline derivatives described in JP-A-9-20885, metal complexes of hydroxyphenyl-substituted triazole derivatives described in JP-A-2000-100570, metal complexes of hydroxyphenyl-substituted oxadiazole or thiadiazole derivatives described in JP-A-10-259372, and hydroxyphenyl-substituted imidazopyridine described in JP-A-2001-57292.

Specific examples of the metal complex of the present invention are illustrated below which, however, are not to be construed as limiting the invention in any way.

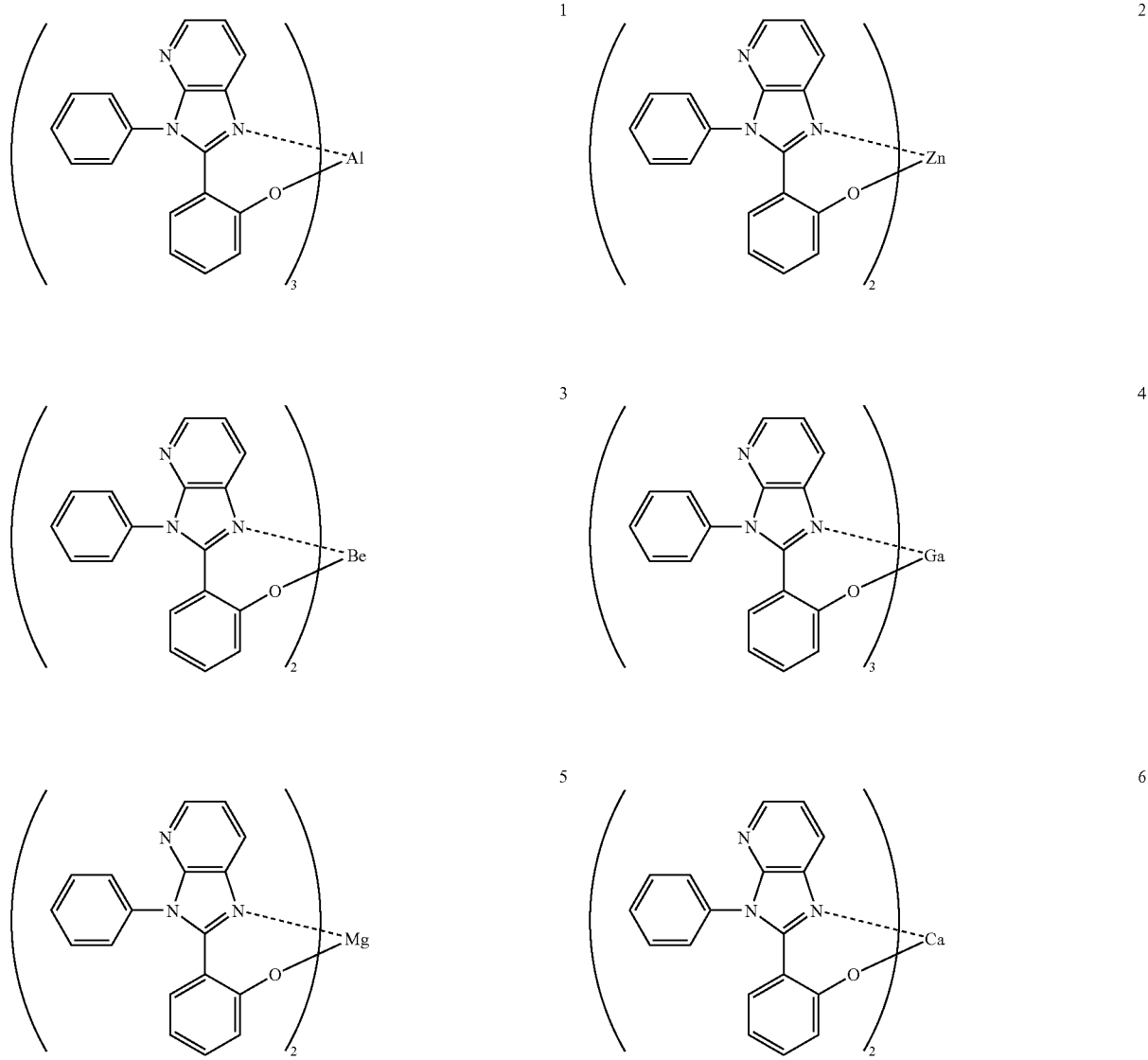

-continued
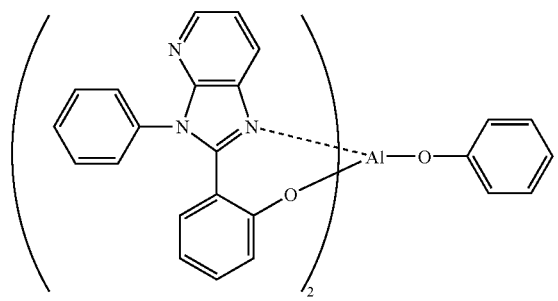
7
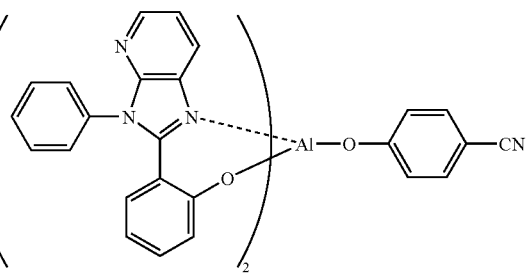
8
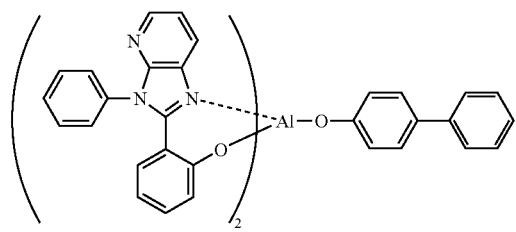
9
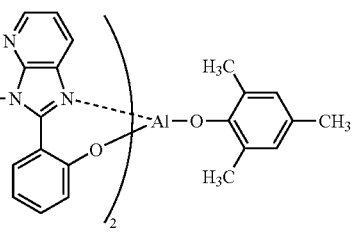
10
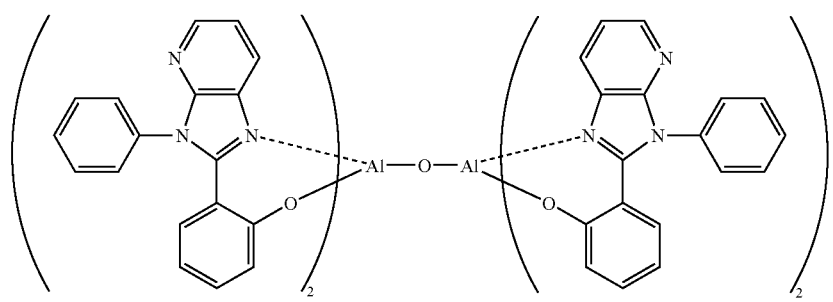
11
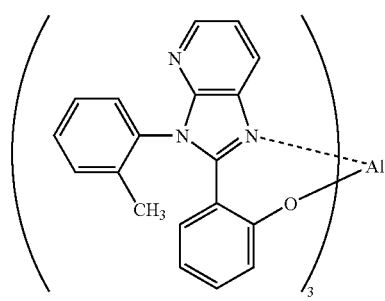
12
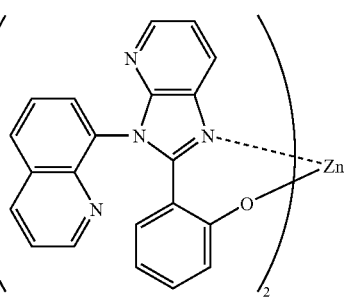
13
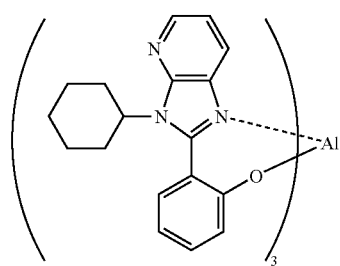
14
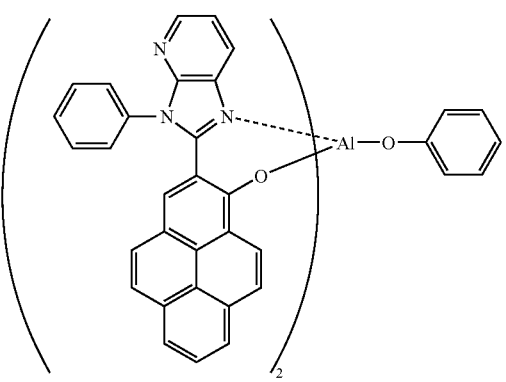
15

-continued
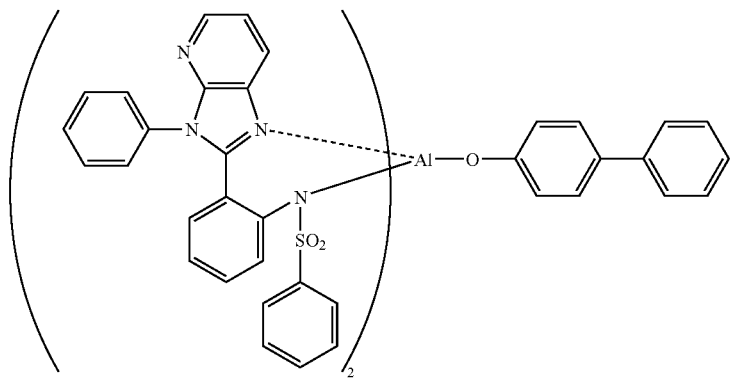
16
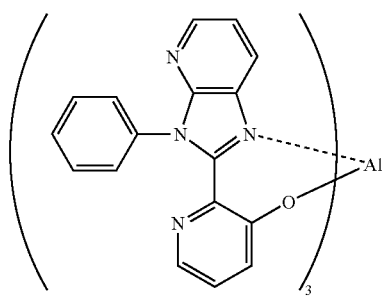
17
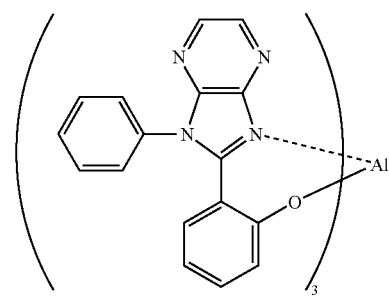
18
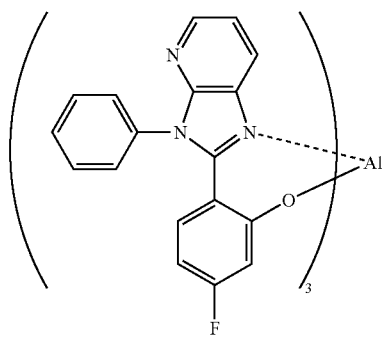
19
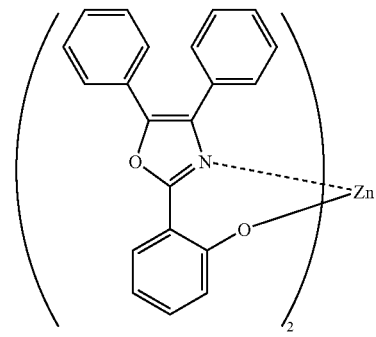
20
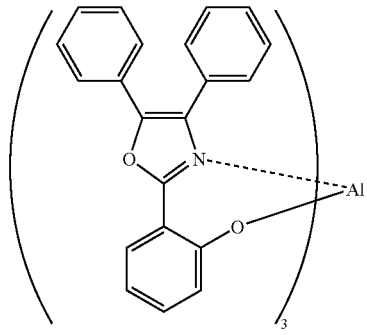
21
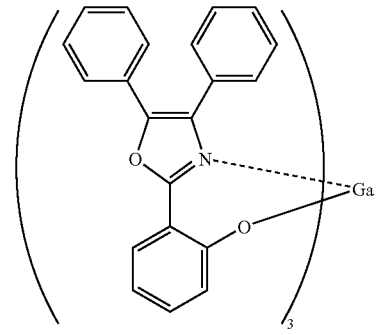
22

-continued
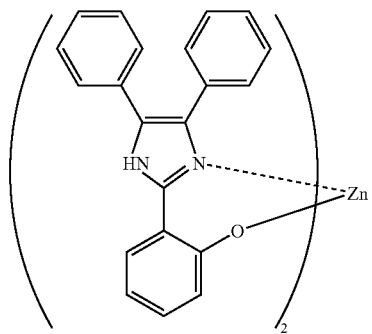
23
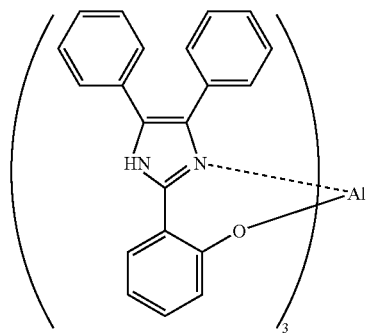
24
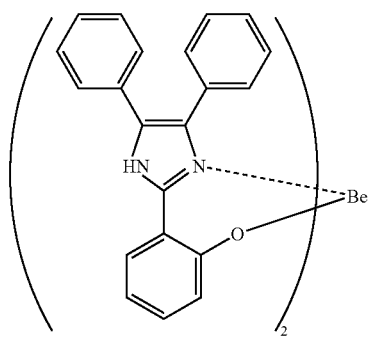
25
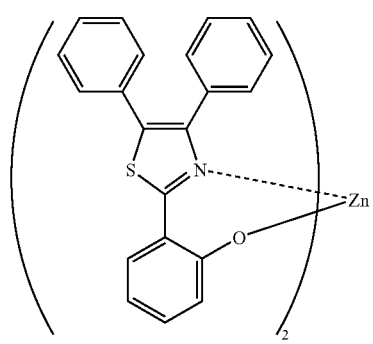
26
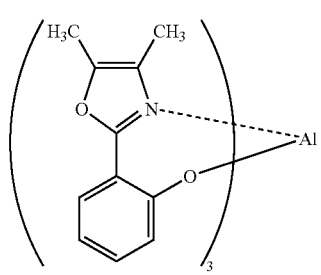
27
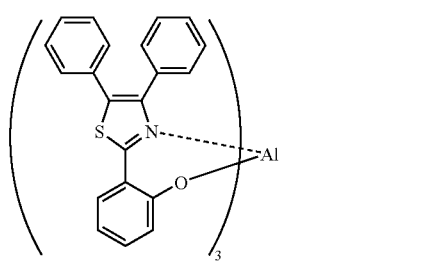
28
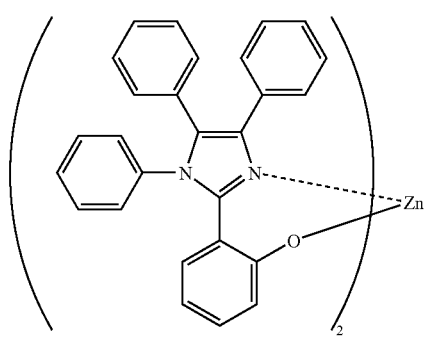
29
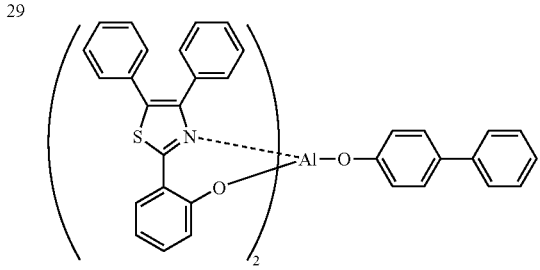
30
31
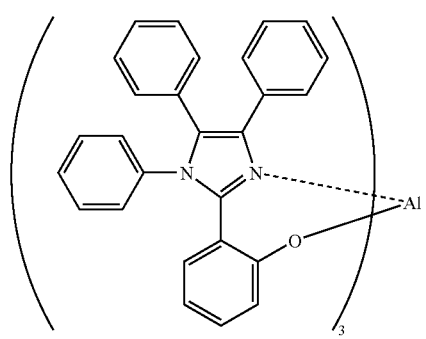
32

-continued
33
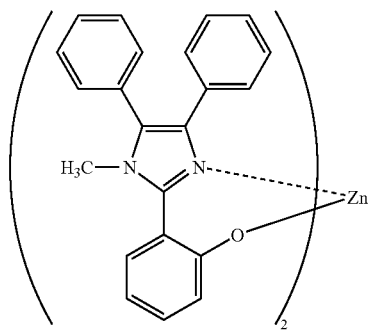
34
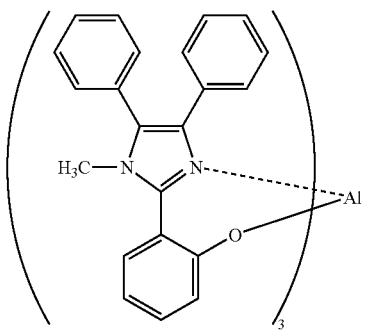
35
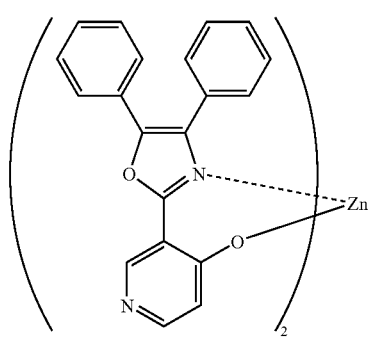
36
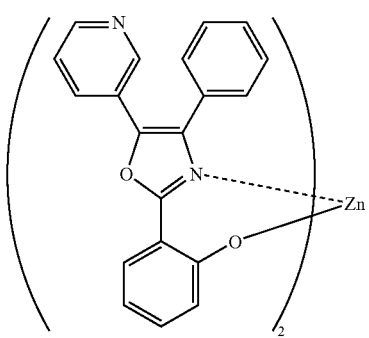
37
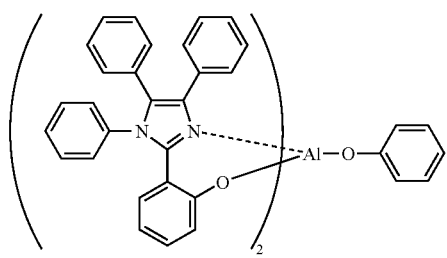
38
39
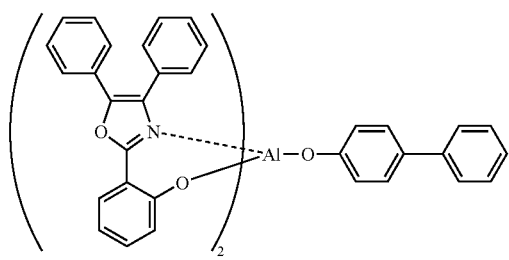
40
41
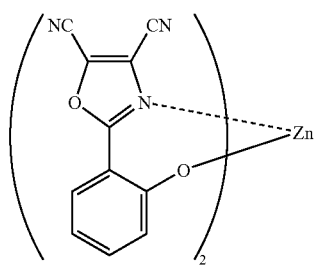
42
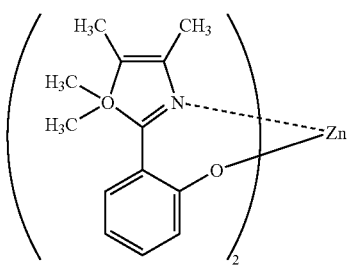

-continued
43
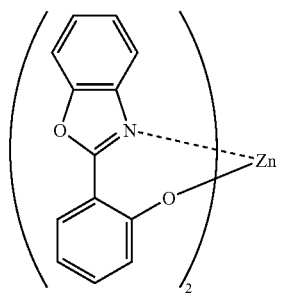
44
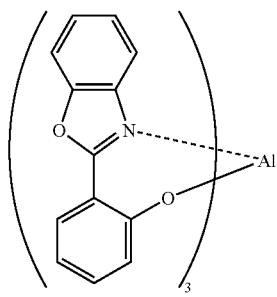
45
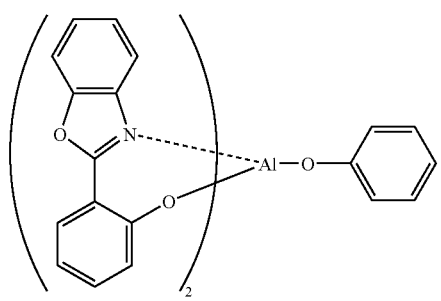
46
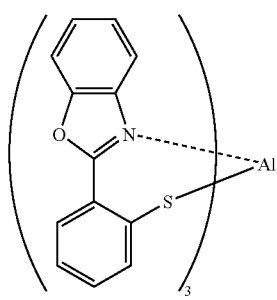
47
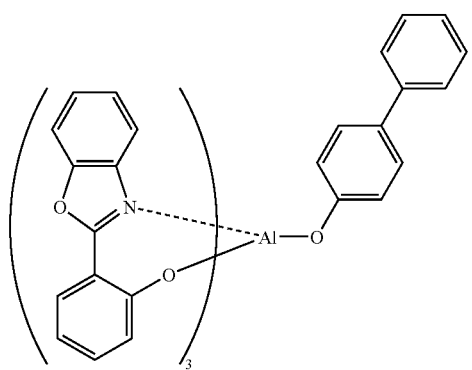
48
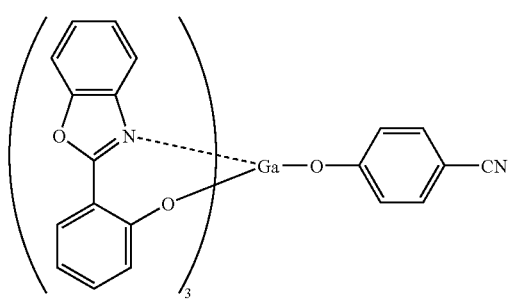
49
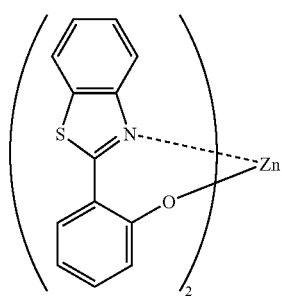
50
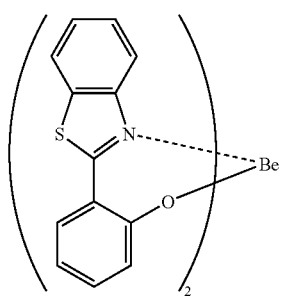
51
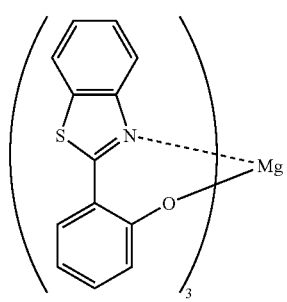
53
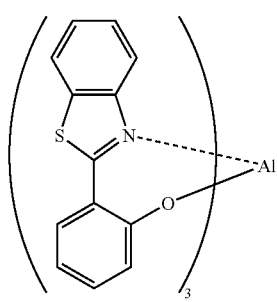

-continued
54
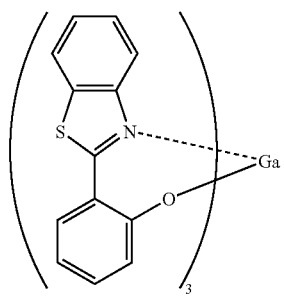
55
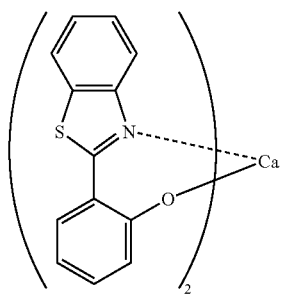
56
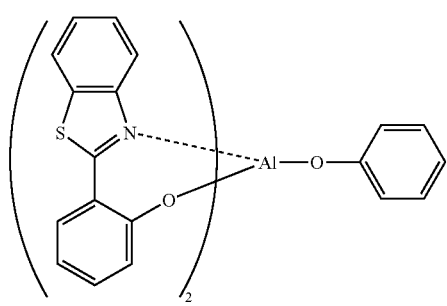
57
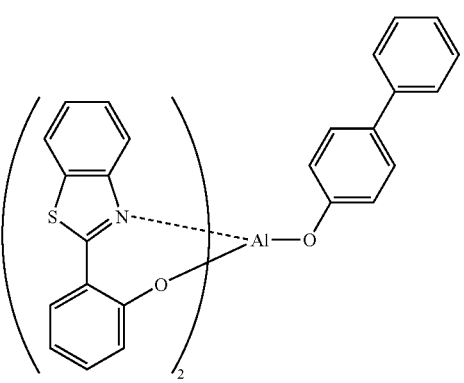
58
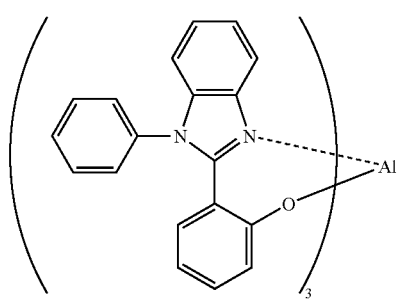
59
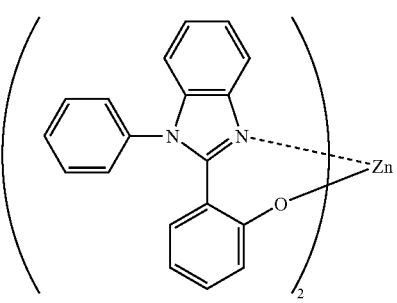
60
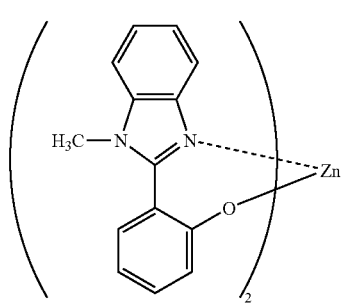
61
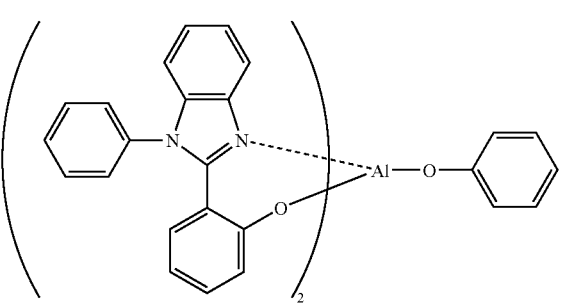
61
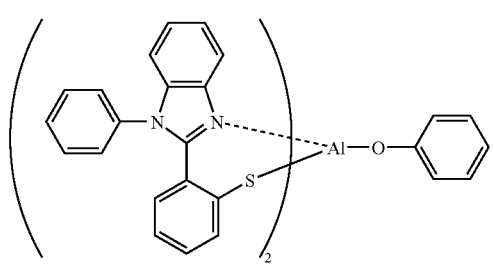
62
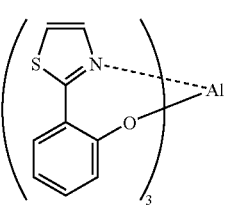

-continued
63
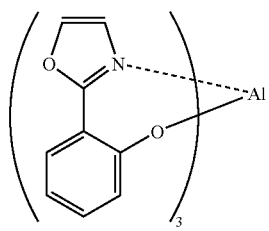
64
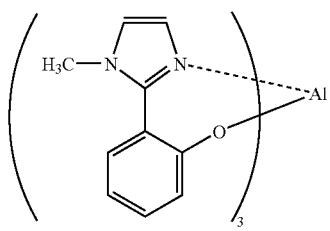
65
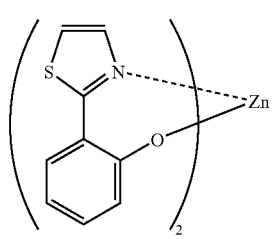
66
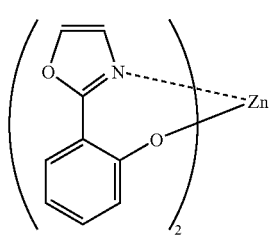
67
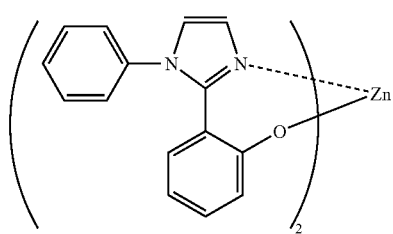
68
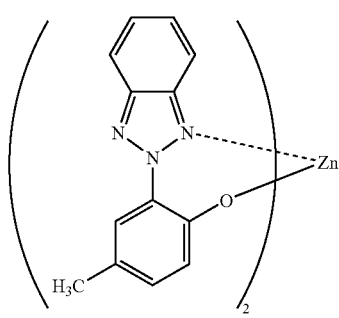
69
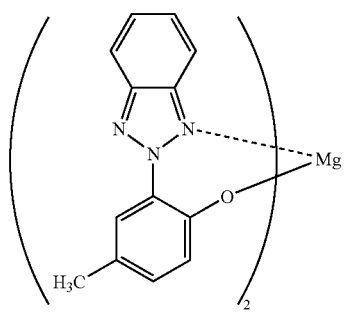
70
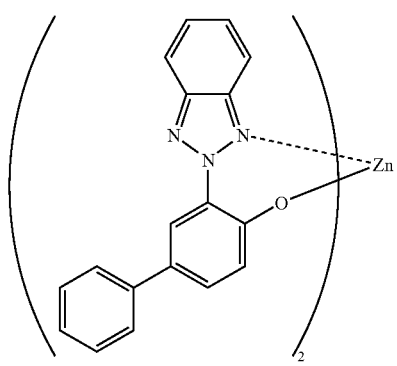
71
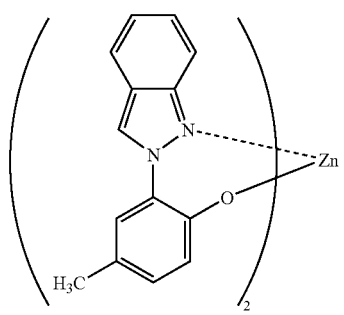
72
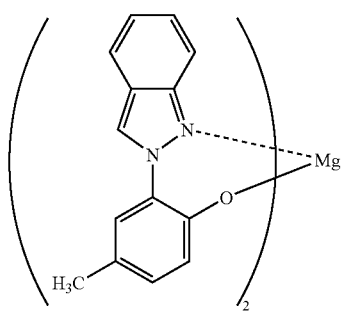

-continued
73
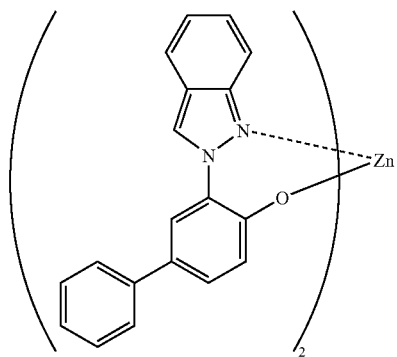
74
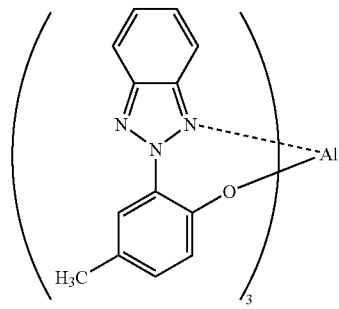
75
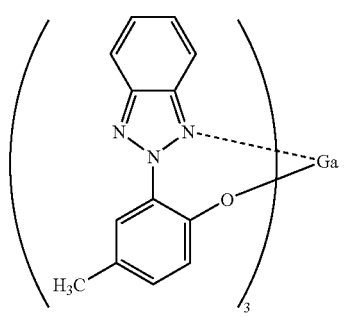
76
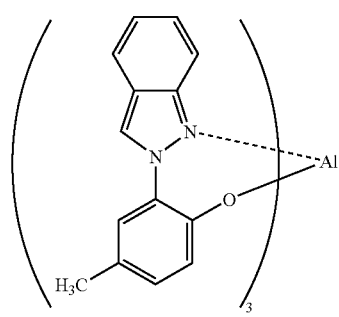
77
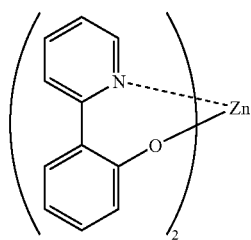
78
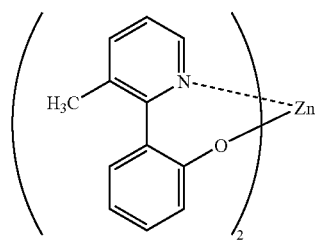
79
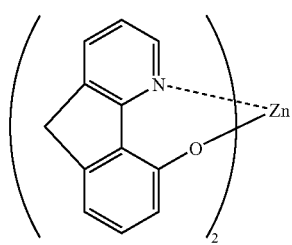
80
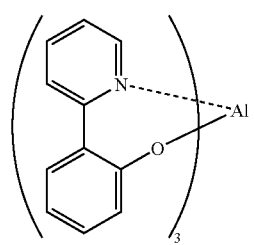
81
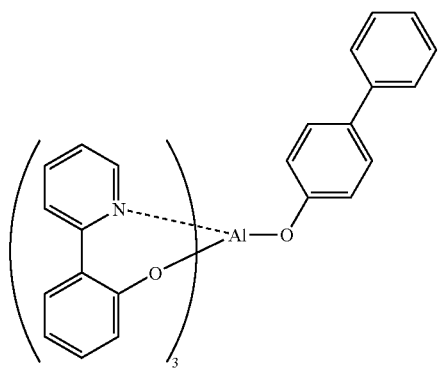
82
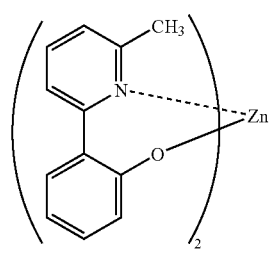

-continued
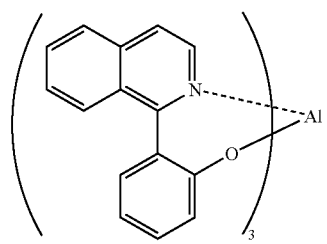 83
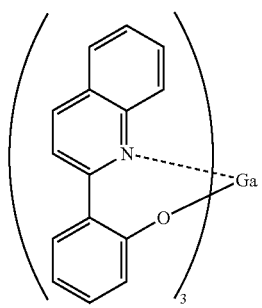 84
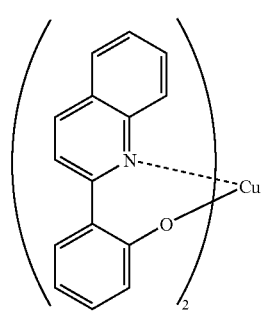 85
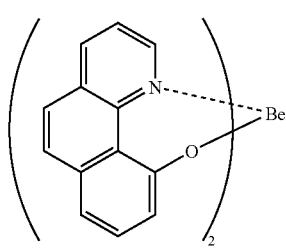 86
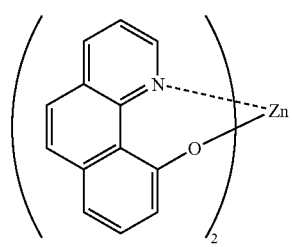 87
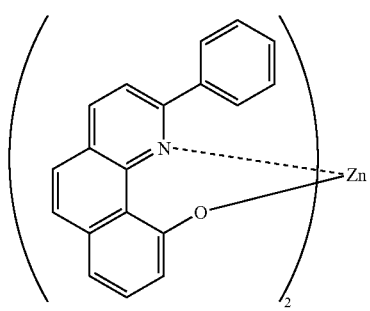 88
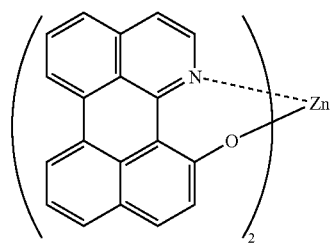 89
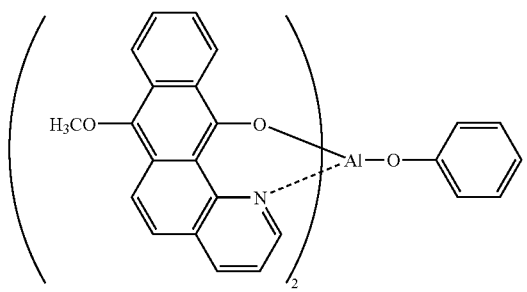 90
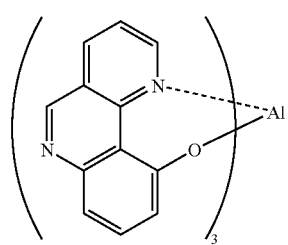 91
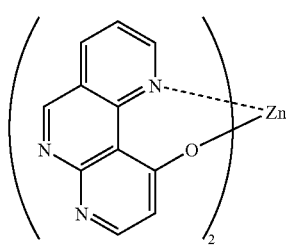 92

-continued
| | |
|---|---|
| 93 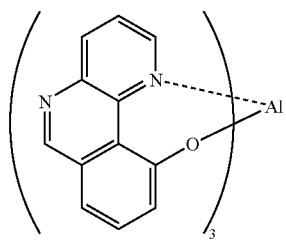 | 94 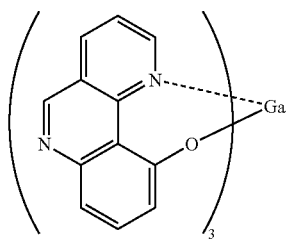 |
| 95 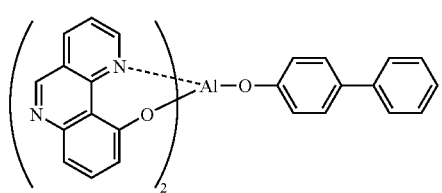 | 96 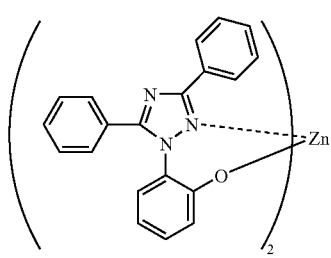 |
| 97 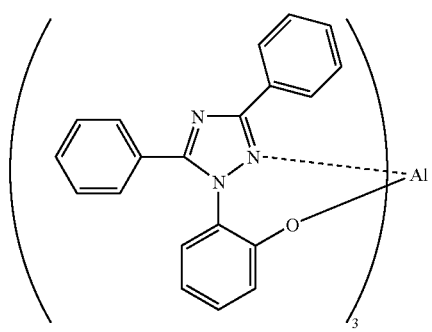 | 98 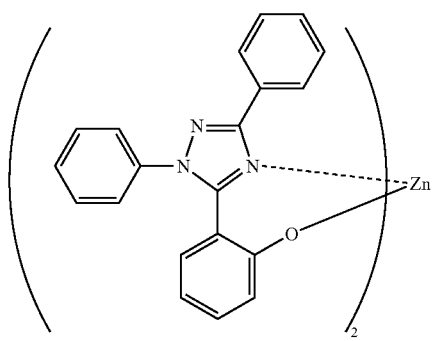 |
| 99 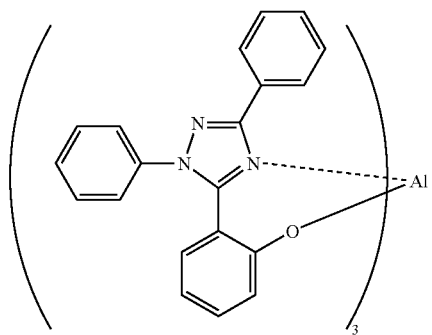 | 100 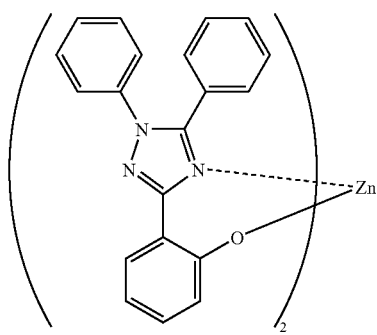 |
| 101 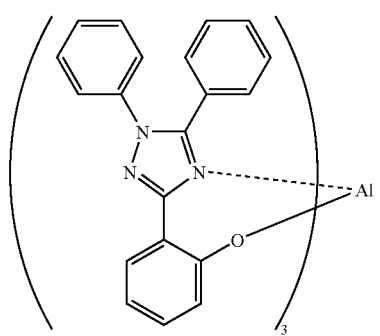 | 102 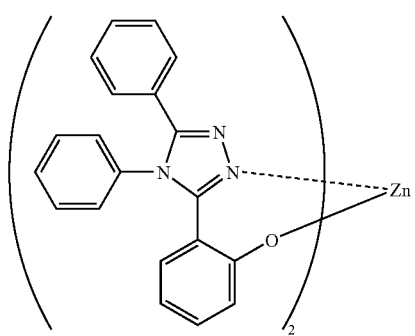 |

-continued
103
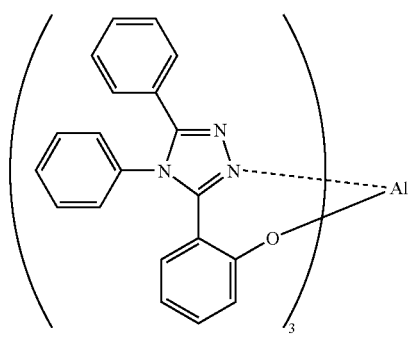
104
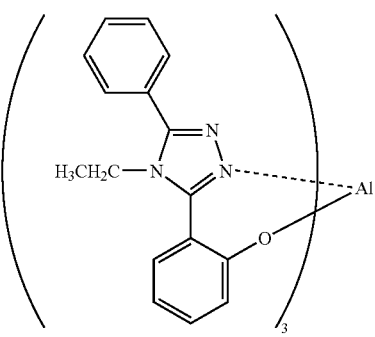
105
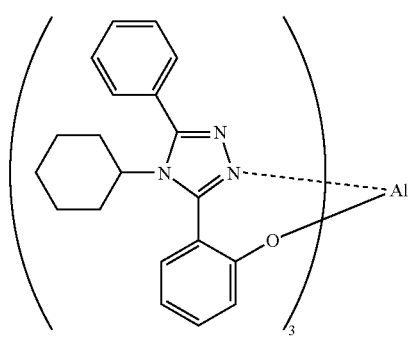
106
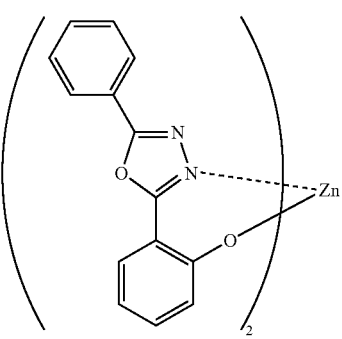
107
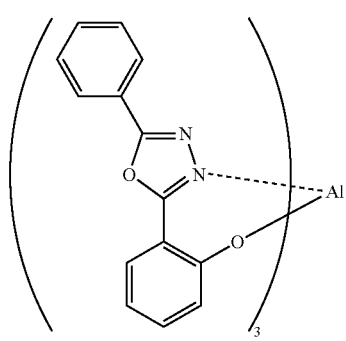
108
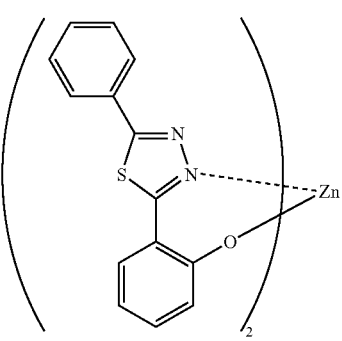
109
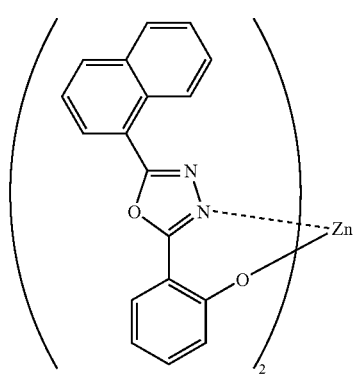
110
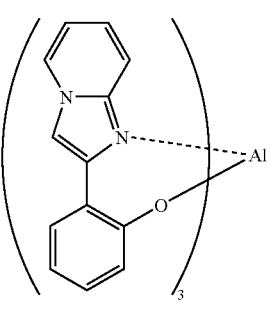

-continued

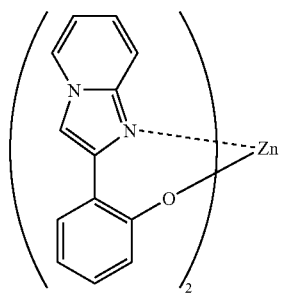
111

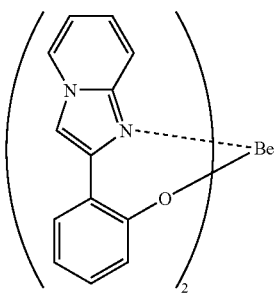
112

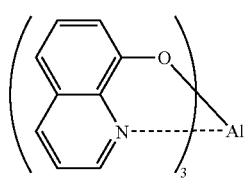
113

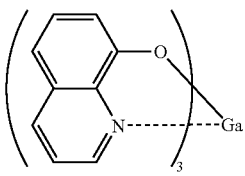
114

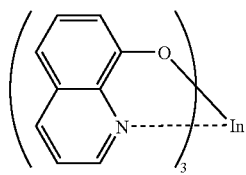
115

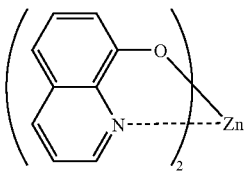
116

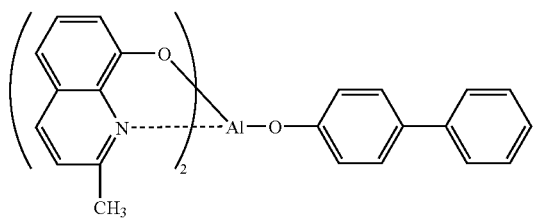
117

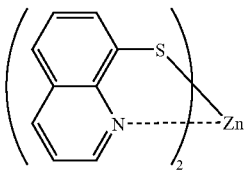
118

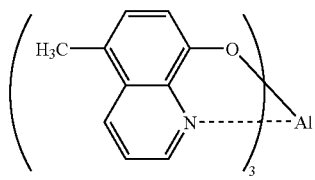
119

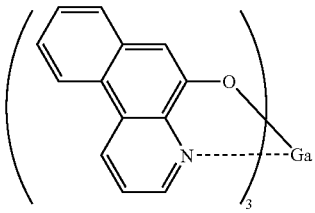
120

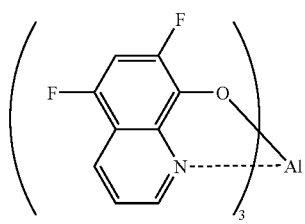
121

The light-emitting element of the invention contains in its light-emitting layer a phosphorescence-emitting material which is used as a guest material. The light-emitting element utilizes light substantially emitted from an excited triplet state. Light emission from the excited triplet state means the same as phosphorescence emission. The light-emitting layer is constituted by preferably a phosphorescence material and a metal complex alone. Hereinafter, the phosphorescence-emitting material is referred to as a "phosphorescence material".

The phosphorescence material of the invention to be used in the invention is not particularly limited, but is preferably a transition metal complex. The central metal of the transition metal complex is not particularly limited, but is preferably iridium, platinum, rhenium or ruthenium, more preferably iridium or platinum, particularly preferably iridium. Of the transition metal complexes, orthometalated complexes are preferred, with orthocarbometalated complexes being more preferred. The term "orthometalated complex" is a general term for a group of compounds described in *Yuki*

*Kinzoku, Kiso To Oyo*, written by Akio Yamamoto and published by Shokabo Sha in 1982, p. 150 and p. 232; and *Photochemistry and Photophysics of Coordination Compound* written by H. Yersin and published by Springer-Verlag in 1987, pp. 71 to 77 and pp. 135 to 146.

The phosphorescence materials may be used alone or in combination of two or more of them, and the host materials may also be used alone or in combination of two or more of them. The content of the phosphorescence material in the light-emitting layer is not particularly limited, but is preferably from 0.01% by weight to 50% by weight, more preferably from 0.1% by weight to 40% by weight, particularly preferably from 1% by weight to 30% by weight. The phosphorescence material has a phosphorescence quantum yield at 20° C. or higher of preferably 70% or more, more preferably 80% or more, still more preferably 85% or more.

As the phosphorescence-emitting material, there may be utilized, for example, those described in patent literature such as U.S. Pat. No. 6,303,231 B1, U.S. Pat. No. 6,097,147, WO 00/57676, WO 00/70655, WO 01/08230, WO 01/39234 A2, WO 01/41512 A1, WO 02/02714 A2, WO 02/15645 A1, JP-A-2001-247859, EP 1211257, JP-A-2002-226495, JP-A-2002-234894, JP-A-2001-247859, JP-A-2001-298470, JP-A-2002-173674, JP-A-2002-203678 and JP-A-2002-203679, and non-patent literature such as *Nature*, vol.395, p. 151 (1998), *Applied Physics Letters*, vol.75, p. 4 (1999), *Polymer Preprints*, vol.41, p. 770 (2000), *Journal of American Chemical Society*, vol.123, p. 4304 (2001) and *Applied Physics Letters*, vol.79, p. 2082 (1999).

The phosphorescence life (at room temperature) of the phosphorescent compound of the present invention is not specifically restricted, and is preferably 1 ms or shorter, more preferably 100 μs or shorter, and still more preferably 10 μs or shorter.

The organic EL element of the invention is characterized in that an electron transporting material represented by the formula (E-I) is used in the electron transporting layer. The content of the compound represented by the formula (E-I) and the content of the compound corresponding to the lower concept of the compound of the formula (E-I) are not particularly limited, but are preferably from 50% by weight to 100% by weight, more preferably from 75% by weight to 100% by weight, particularly preferably from 90% by weight to 100% by weight.

In the formula (E-I), A represents a heterocyclic group wherein two or more aromatic hetero rings are condensed to each other, and the heterocyclic groups represented by A may be the same or different from each other. m represents an integer of 2 or more. L represents a linking group.

A represents a heterocyclic group wherein two or more aromatic hetero rings are condensed to each other, and the heterocyclic groups represented by A may be the same or different from each other. The heterocyclic group represented by A is preferably a heterocyclic group wherein 5- or 6-membered aromatic hetero rings are condensed to each other, more preferably a heterocyclic group wherein 2 to 6, more preferably 2 to 3, particularly preferably 2 aromatic hetero rings are condensed to each other. As the hetero atom contained in the ring, N, O, S, Se and Te atoms are preferred, N, O and S atoms are more preferred, and N atom is still more preferred.

Specific examples of the aromatic heterocyclic group constituting the heterocyclic group represented by A include furan, thiophene, pyran, pyrrole, imidazole, pyrazole, pyridine, pyrazine, pyrimidine, pyridazine, thiazole, oxazole, isothiazole, isoxazole, thiadiazole, oxadiazole, triazole, selenazole and tellurazole, preferred examples thereof include imidazole, pyrazole, pyridine, pyrazine, pyrimidine, pyridazine, thiazole and oxazole, and more preferred examples thereof include imidazole, thiazole, oxazole, pyridine, pyrazine, pyrimidine and pyridazine.

Specific examples of the condensed ring represented by A include indolizine, purine, pteridine, carboline, pyrroloimidazole, pyrrolotriazole, pyrazoloimidazole, pyrazolotriazole, pyrazolopyrimidine, pyrazolotriazine, triazolopyridine, tetrazaindene, pyrroloimidazole, pyrrolotriazole, imidazoimidazole, imidazopyridine, imidazopyrazine, imidazopyrimidine, imidazopyridazine, oxazolopyridine, oxazolopyrazine, oxazolopyrimidine, oxazolopyridazine, thiazolopyridine, thiazolopyrazine, thiazolopyrimidine and thiazolopyridazine, preferred examples thereof include imidazopyridine, imidazopyrazine, imidazopyrimidine, imidazopyridazine, oxazolopyridine, oxazolopyrazine, oxazolopyrimidine, oxazolopyridazine, thiazolopyridine, thiazolopyrazine, thiazolopyrimidine and thiazolopyridazine, still more preferred examples thereof include imidazopyridine, oxazolopyridine and thiazolopyridine, and particularly preferably imidazopyridine.

The heterocyclic group represented by A may further be condensed with other ring or may have a substituent. As the substituent for the heterocyclic group represented by A, there are illustrated those which belong to the substituent group B.

(Substituent Group B)

An alkyl group (containing preferably from 1 to 30 carbon atoms, more preferably from 1 to 20 carbon atoms, particularly preferably from 1 to 10 carbon atoms; e.g., methyl, ethyl, iso-propyl, tert-butyl, n-octyl, n-decyl, n-hexadecyl, cyclopropyl, cyclopentyl or cyclohexyl), an alkenyl group (containing preferably from 2 to 30 carbon atoms, more preferably from 2 to 20 carbon atoms, particularly preferably from 2 to 10 carbon atoms; e.g., vinyl, allyl, 2-butenyl or 3-pentenyl), an alkynyl group (containing preferably from 2 to 30 carbon atoms, more preferably from 2 to 20 carbon atoms, particularly preferably from 2 to 10 carbon atoms; e.g., propargyl or 3-pentynyl), an aryl group (containing preferably from 6 to 30 carbon atoms, more preferably from 6 to 20 carbon atoms, particularly preferably from 6 to 12 carbon atoms; e.g., phenyl, p-methylphenyl or naphthyl), an amino group (containing preferably from 0 to 30 carbon atoms, more preferably from 0 to 20 carbon atoms, particularly preferably from 0 to 10 carbon atoms; e.g., amino, methylamino, dimethylamino, diethylamino, dibenzylamino, diphenylamino or ditolylamino), an alkoxy group (containing preferably from 1 to 30 carbon atoms, more preferably from 1 to 20 carbon atoms, particularly preferably from 1 to 10carbon atoms; e.g., methoxy, ethoxy, butoxy or 2-ethylhexyloxy), an aryloxy group (containing preferably from 6 to 30 carbon atoms, more preferably from 6 to 20 carbon atoms, particularly preferably from 6 to 12 carbon atoms; e.g., phenyloxy, 1-naphthyloxy or 2-naphthyloxy), an acyl group (containing preferably from 1 to 30 carbon atoms, more preferably from 1 to 20 carbon atoms, particularly preferably from 2 to 12 carbon atoms; e.g., acetyl, benzoyl, formyl or pivaloyl), an alkoxycarbonyl group (containing preferably from 2 to 30 carbon atoms, more preferably from 2 to 20 carbon atoms, particularly preferably from 2 to 12 carbon atoms; e.g., methoxycarbonyl or ethoxycarbonyl), an aryloxycarbonyl group (containing preferably from 7 to 30 carbon atoms, more preferably from 7 to 20 carbon atoms, particularly preferably from 7 to 12 carbon atoms; e.g., phenyloxycarbonyl), an acyloxy group (containing preferably from 2 to 30 carbon atoms, more preferably from 2 to 20 carbon atoms, particularly preferably from 2 to 10 carbon atoms; e.g., acetoxy or benzoyloxy), an acylamino group (containing preferably from 2 to 30 carbon atoms, more preferably from 2 to 20 carbon atoms, particularly preferably from 2 to 10 carbon atoms; e.g., acetylamino or benzoylamino), an alkoxycarbonylamino group (containing preferably from 2 to 30 carbon atoms, more preferably from 2 to 20 carbon atoms, particularly preferably from 2 to 12 carbon atoms; e.g., methoxycarbonylamino), an aryloxycarbonylamino group (containing preferably from 7 to 30 carbon atoms, more preferably from 7 to 20 carbon atoms, particularly preferably from 7 to 12 carbon atoms; e.g., phenyloxycarbonylamio), a sulfonylamino group (containing preferably from 1 to 30 carbon atoms, more preferably from 1 to 20 carbon atoms, particularly preferably from 1 to 12 carbon atoms; e.g., methanesulfonylamino or benzenesulfonylamino), a sulfamoylamino group (containing preferably containing from 0 to 30 carbon atoms, more preferably from 0 to 20 carbon atoms, particularly preferably from 0 to 12 carbon atoms; e.g., sulfamoyl, methylsulfamoyl, dimethylsulfamoyl or phenylsulfamoyl), a carbamoyl group (containing preferably containing from 1 to 30 carbon atoms, more preferably from 1 to 20 carbon atoms, particularly preferably from 1 to 12 carbon atoms; e.g., carbamoyl, methylcarbamoyl, diethylcarbamoyl or phenylcarbamoyl), an alkylthio group (containing preferably from 1 to 30 carbon atoms, more preferably from 1 to 20 carbon atoms, particularly preferably from 1 to 12 carbon atoms; e.g., methylthio or ethylthio), an arylthio group (containing preferably from 6 to 30 carbon atoms, more preferably from 6 to 20 carbon atoms, particularly preferably from 6 to 12 carbon atoms; e.g., phenylthio), a sulfonyl group (containing preferably from 1 to 30 carbon atoms, more preferably from 1 to 20 carbon atoms, particularly preferably from 1 to 12 carbon atoms; e.g., mesyl or tosyl), a sulfinyl group (containing preferably from 1 to 30 carbon atoms, more preferably from 1 to 20 carbon atoms, particularly preferably from 1 to 12 carbon atoms; e.g., methanesulfinyl or benzenesulfinyl), a ureido group (containing preferably from 1 to 30 carbon atoms, more preferably from 1 to 20 carbon atoms, particularly preferably from 1 to 12 carbon atoms; e.g., ureido, methylureido or phenylureido), a phosphoric acid amido group (containing preferably from 1 to 30 carbon atoms, more preferably from 1 to 20 carbon atoms, particularly preferably from 1 to 12 carbon atoms; e.g., diethylphosphoric acid amido or phenylphosphoric acid amido), a hydroxyl group, a mercapto group, a halogen atom (e.g., a fluorine atom, a chlorine atom or an iodine atom), a cyano group, a sulfo group, a carboxyl group, a nitro group, a hydroxamic acid group, a sulfino group, a hydrazino group, an imino group, a heterocyclic group (containing preferably from 1 to 30 carbon atoms, more preferably from 1 to 12 carbon atoms and containing, for example, a nitrogen atom, an oxygen atom or a sulfur atom as a hetero atom; specific examples thereof being imidazolyl, pyridyl, quinolyl, furyl, thienyl, piperidyl, morpholino, benzoxazolyl, benzimidazolyl or benzothiazolyl), and a silyl group (containing preferably from 3 to 40 carbon atoms, more preferably from 3 to 30 carbon atoms, particularly preferably from 3 to 24 carbon atoms; e.g., trimethylsilyl or triphenylsilyl). These substituents may further be substituted. Also, in the case where two or more substituent exist, they may be the same or different from each other and, if possible, they may be connected to each other to form a ring.

Preferred examples of the substituent represented by A include an alkyl group, an alkenyl group, an alkynyl group, an aryl group, an amino group, an alkoxy group, an aryloxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a sulfonyl group, a halogen atom, a cyano group and a heterocyclic group, more preferred examples thereof include an alkyl group, an alkenyl group, an aryl group, an alkoxy group, an aryloxy group, a halogen atom, a cyano group and a heterocyclic group, still more preferred examples thereof include an alkyl group, an aryl group, an alkoxy group, an aryloxy group and an aromatic heterocyclic group, and particularly preferred examples thereof include an alkyl group, an aryl group, an alkoxy group and an aromatic heterocyclic group.

m represents an integer of 2 or more, preferably from 2 to 8, more preferably from 2 to 6, still more preferably from 2 to 4, particularly preferably 2 or 3, most preferably 3.

L represents a linking group. Preferred examples of the linking group represented by L include a single bond and those linking groups which are formed by C, N, O, S, Si, Ge, etc., more preferred examples thereof include a single bond, alkylene, alkenylene, alkynylene, arylene, a divalent hetero ring (preferably an aromatic hetero ring, more preferably an aromatic hetero ring formed by an azole ring, a thiophene ring or a furan ring), and a group composed of a combination of N and these groups, and still more preferred examples thereof include arylene, a divalent aromatic heterocyclic group, and a combination of N and these. Specific examples of the linking group represented by L include the following ones in addition to a single bond.

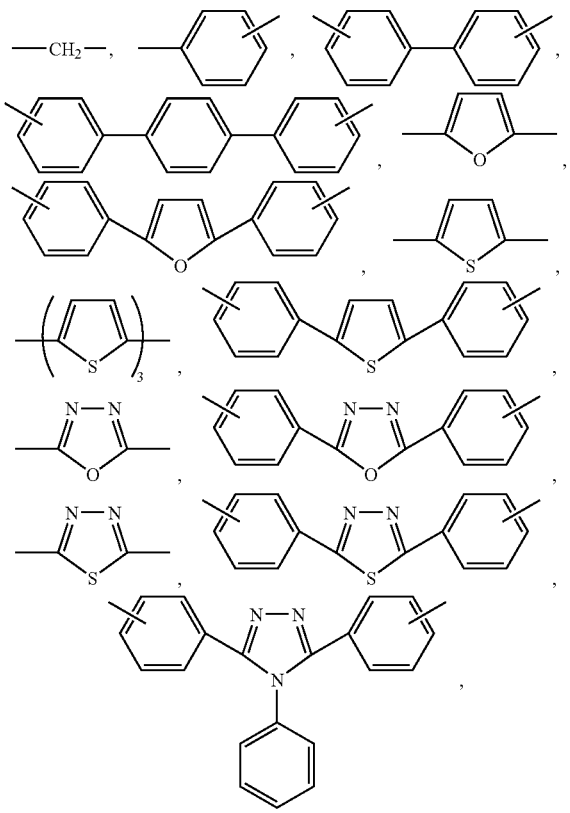

-continued
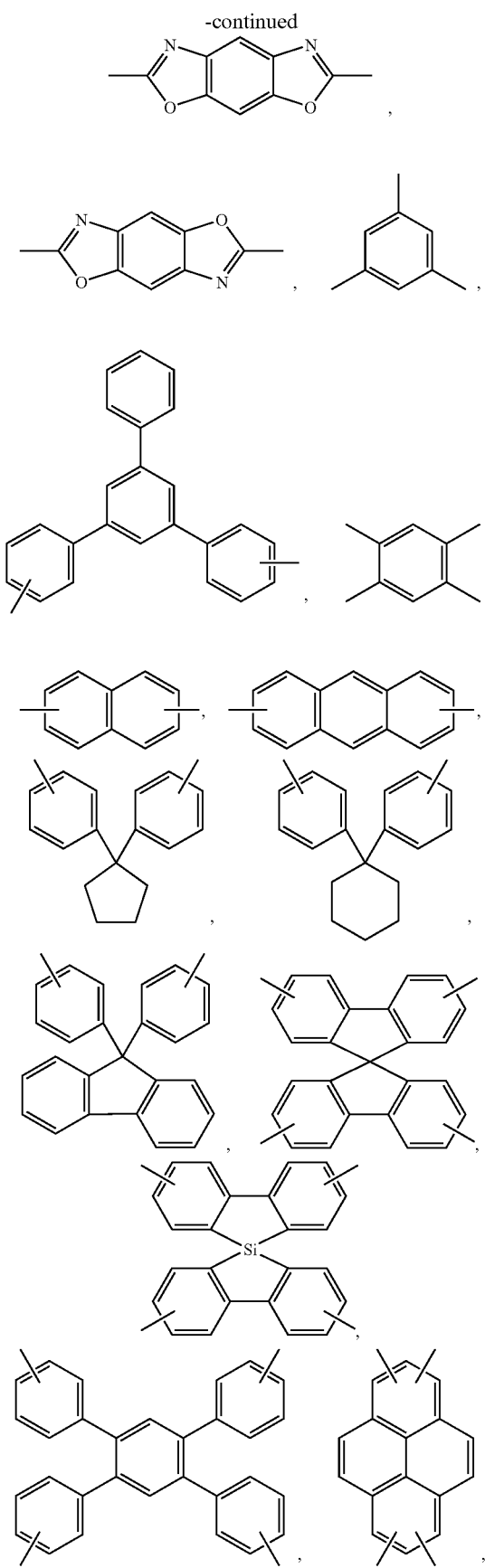
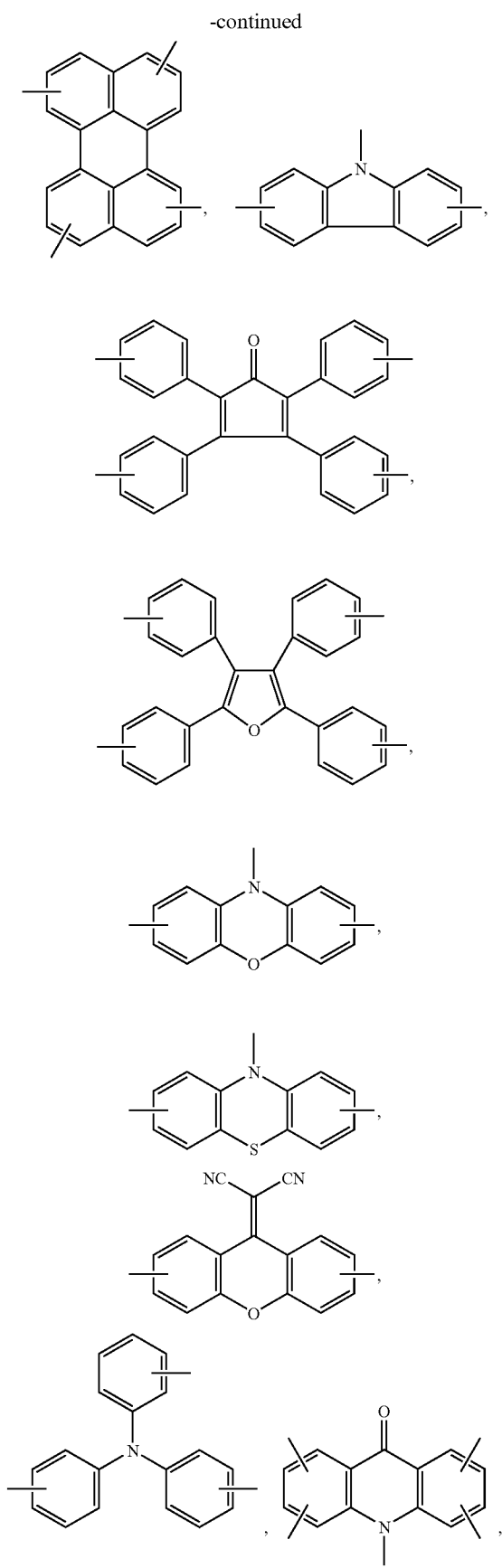

-continued

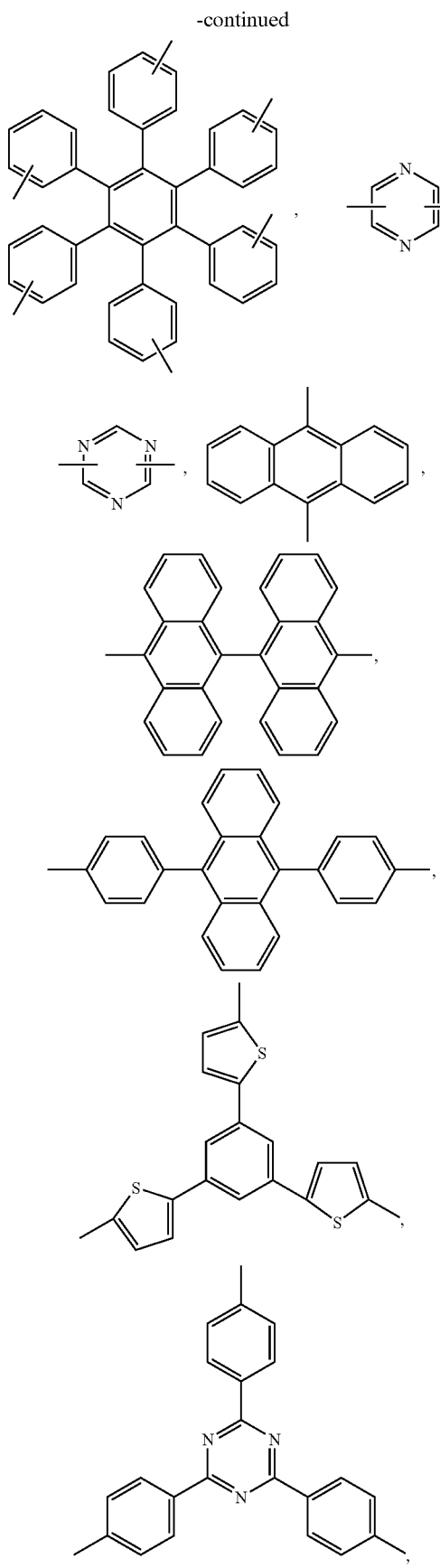

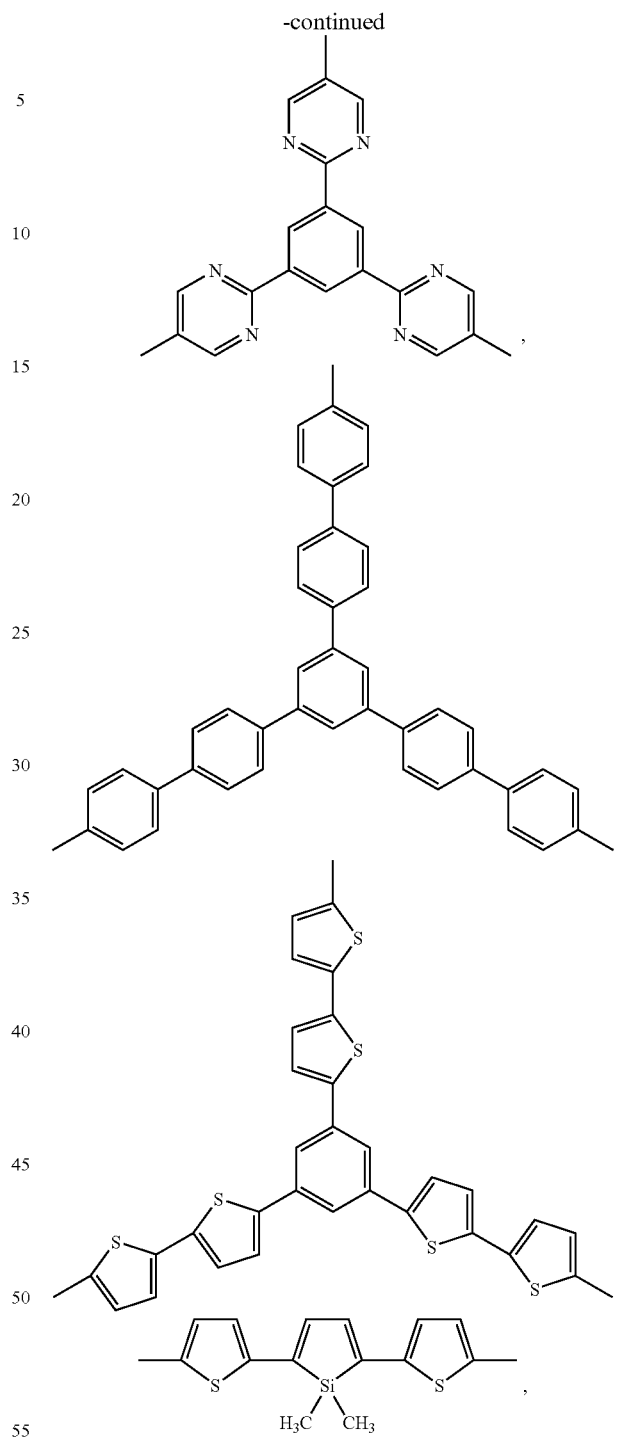

The linking group represented by L may have a substituent and, as such substituent, there may be used, for example, those which have been illustrated as substituents for the heterocyclic group represented by A. Preferred examples of the substituent for L include an alkyl group, an alkenyl group, an alkynyl group, an aryl group, an alkoxy group, an aryloxy group, an acyl group, a halogen atom, a cyano group, a heterocyclic group and a silyl group, more preferred examples thereof include an alkyl group, an alkenyl group, an alkynyl group, an aryl group, an alkoxy group, an aryloxy group, a halogen atom, a cyano group and an aromatic heterocyclic group, and still more preferred examples thereof include an alkyl group, an aryl group and an aromatic heterocyclic group.

Of the compounds represented by the formula (E-I), those compounds which are represented by the formula (E-II) are preferred. In the formula (E-II), X represents O, S, Se, Te or N—R. R represents a hydrogen atom, an aliphatic hydrocarbon group, an aryl group or a heterocyclic group. $Q^2$ represents atoms necessary for forming an aromatic hetero ring. m represents an integer of 2 or more. L represents a linking group.

m and L are the same as those defined with respect to the formula (E-I), and preferred scopes thereof are also the same as described there. X represents O, S, Se, Te or N—R. R represents a hydrogen atom, an aliphatic hydrocarbon group, an aryl group or a heterocyclic group. $Q^2$ represents atoms necessary for forming an aromatic hetero ring.

Preferred examples of the aliphatic hydrocarbon group represented by R include an alkyl group (containing preferably from 1 to 20 carbon atoms, more preferably from 1 to 12 carbon atoms, particularly preferably from 1 to 8 carbon atoms; e.g., methyl, ethyl, iso-propyl, tert-butyl, n-octyl, n-decyl, n-hexadecyl, cyclopropyl, cyclopentyl and cyclohexyl), an alkenyl group (containing preferably from 2 to 20 carbon atoms, more preferably from 2 to 12 carbon atoms, particularly preferably from 2 to 8 carbon atoms; e.g., vinyl, allyl, 2-butenyl and 3-pentenyl), an alkynyl group (containing preferably from 2 to 20 carbon atoms, more preferably from 2 to 12 carbon atoms, particularly preferably from 2 to 8 carbon atoms; e.g., propargyl and 3-pentynyl), with an alkyl group and an alkenyl group being more preferred.

Preferred examples of the aryl group represented by R are those which contain preferably from 6 to 30 carbon atoms, more particularly from 6 to 20 carbon atoms, particularly preferably from 6 to 12 carbon atoms and include phenyl, 4-methylphenyl, 4-methoxyphenyl, 3-trifluoromethylphenyl, pentafluorophenyl, 1-naphthyl and 2-naphthyl.

The heterocyclic group represented by R is a heterocyclic group containing a single ring or a condensed ring (a heterocyclic group containing preferably from 1 to 20 carbon atoms, more preferably from 1 to 12 carbon atoms, still more preferably from 2 to 10 carbon atoms) and is preferably an aromatic heterocyclic group containing at least one of a nitrogen atom, an oxygen atom and a selenium atom.

Specific examples of the heterocyclic group represented by R include pyrrolidine, piperidine, pyrrole, furan, thiophene, imidazoline, imidazole, benzimidazole, naphthimidazole, thiazolidine, thiazole, benzothiazole, naphthothiazole, isothiazole, oxazoline, oxazole, benzoxazole, naphthoxazole, isoxazole, selenazole, benzoselenazole, naphthoselenazole, pyridine, quinoline, isoquinoline, indole, indolenine, pyrazole, pyrazine, pyrimidine, pyridazine, triazine, indazole, purine, phthalazine, naphthyridine, quinoxaline, quinazoline, cinnoline, pteridine, phenanthridine, phenanthroline and tetrazaindene. Preferred examples thereof include furan, thiophene, pyridine, quinoline, pyrazine, pyrimidine, pyridazine, triazine, phthalazine, naphthyridine, quinoxaline and quinazoline, and more preferred examples include furan, thiophene, pyridine and quinoline.

The aliphatic hydrocarbon group, the aryl group and the heterocyclic group represented by R may have a substituent or substituents. As such substituents, there may be used those substituents which have been illustrated as substituents for the heterocyclic group represented by A in the formula (E-I), with preferred substituents being the same as described there.

Preferred exmples of R include an alkyl group, an aryl group and an aromatic heterocyclic group, more preferred examples thereof include an aryl group and an aromatic group, and still more preferred examples thereof include an aryl group.

X is preferably O, S or N—R, more preferably O or N—R, still more preferably N—R, particularly preferably N—Ar (Ar being an aryl group, more preferably an aryl group containing from 6 to 30 carbon atoms, still more preferably from 6 to 20 carbon atoms, particularly preferably from 6 to 12 carbon atoms).

$Q^2$ represents atoms necessary for forming an aromatic hetero ring. The aromatic hetero ring formed by $Q^2$ is preferably a 5- or 6-membered aromatic hetero ring, more preferably a 5- or 6-membered, nitrogen-containing aromatic hetero ring, still more preferably a 6-membered, nitrogen-containing aromatic hetero ring.

Specific examples of the aromatic heterocyclic group formed by $Q^2$ include furan, thiophene, pyran, pyrrole, imidazole, pyrazole, pyridine, pyrazine, pyrimidine, pyridazine, thiazole, oxazole, isothiazole, isoxazole, thiadiazole, oxadiazole, triazole, selenazole and tellurazole. Preferred examples thereof include pyridine, pyrazine, pyrimidine and pyridazine. More preferred are pyridine and pyrazine, with pyridine being still more preferred. Further, the aromatic hetero ring formed by $Q^2$ may be condensed with other ring to form a condensed ring, or may have a substituent. As the substituent, those which have been illustrated as substituents for the heterocyclic group represented by A in the formula (E-I) may be employed, with preferred substituents being the same as described there.

Of the compounds represented by the formula (E-I), those compounds which are represented by the formula (E-III) are more preferred. In the formula (E-III), X represents O, S, Se, Te or N—R. R represents a hydrogen atom, an aliphatic hydrocarbon group, an aryl group or a heterocyclic group. $Q^3$ represents atoms necessary for forming a nitrogen-containing aromatic hetero ring. m represents an integer of 2 or more. L represents a linking group.

In the formula (E-III), m and L are the same as those defined with respect to the formula (E-I), and preferred scopes thereof are also the same as described there. X is the same as that defined with respect to the formula (E-III), and preferred scopes thereof are also the same as described there. $Q^3$ represents atoms necessary for forming a nitrogen-containing aromatic hetero ring.

The nitrogen-containing aromatic hetero ring formed by $Q^3$ is preferably a 5- or 6-membered, nitrogen-containing aromatic hetero ring, more preferably a 6-membered, nitrogen-containing aromatic hetero ring.

Specific examples of the aromatic hetero ring formed by $Q^3$ include pyrrole, imidazole, pyrazole, pyridine, pyrazine, pyrimidine, pyridazine, thiazole, oxazole, isothiazole, isoxazole, thiadiazole, oxadiazole, triazole, selenazole and tellurazole. Preferred examples thereof are pyridine, pyrazine, pyrimidine and pyridazine, with pyridine and pyrazine being more preferred, and pyridine being still more preferred.

The aromatic hetero ring formed by $Q^3$ may be condensed with other ring to form a condensed ring, or may have a substituent. As the substituent, those substituents which have been illustrated as substituents for the heterocyclic group represented by A in the formula (E-I) may be employed, with preferred substituents being the same as described there.

Of the compounds represented by the formula (E-I), those compounds which are represented by the formula (E-IV) are more preferred. In the formula (E-IV), $X^4$ represents O, S or N—R. R represents a hydrogen atom, an aliphatic hydrocarbon group, an aryl group or a heterocyclic group. $Q^4$ represents atoms necessary for forming a 6-membered, nitrogen-containing aromatic hetero ring. m represents an integer of from 2 to 8. L represents a linking group.

L is the same as defined with respect to the formula (E-I), and preferred scope thereof is also the same as described there. $X^4$ represents O, S or N—R. R is the same as defined with respect to the formula (E-II), and preferred scope thereof is also the same as described there. $Q^4$ represents atoms necessary for forming a 6-membered, nitrogen-containing aromatic hetero ring. Specific examples of the aromatic hetero ring formed by $Q^4$ include pyridine, pyrazine, pyrimidine, pyridazine and triazine. Preferred examples thereof are pyridine, pyrazine, pyrimidine and pyridazine, with pyridine and pyrazine being more preferred, and pyridine being still more preferred. m represents an integer of from 2 to 8, preferably from 2 to 6, more preferably from 2 to 4, still more preferably 3.

Of the compounds represented by the formula (E-I), those compounds which are represented by the formula (V) are more preferred. In the formula (E-V), R represents a hydrogen atom, an aliphatic hydrocarbon group, an aryl group or a heterocyclic group. $Q^5$ represents atoms necessary for forming a 6-membered, nitrogen-containing aromatic hetero ring. m represents an integer of from 2 to 8. L represents a linking group.

L is the same as defined with respect to the formula (E-I), and preferred scope thereof is also the same as described there. R is the same as defined with respect to the formula (E-II), and preferred scope thereof is also the same as described there. $Q^5$ is the same as $Q^4$ in the formula (E-IV), and preferred scope thereof is also the same as described there. m is the same as defined with respect to the formula (E-IV), and preferred scope thereof is also the same as described there.

Of the compounds represented by the formula (E-I), those compounds which are represented by the formula (E-VI) are more preferred. In the formula (E-VI), $Q^{61}$, $Q^{62}$ and $Q^{63}$ each represents atoms necessary for forming a 6-membered, nitrogen-containing aromatic hetero ring. $R^{61}$, $R^{62}$ and $R^{63}$ each represents a hydrogen atom, an aliphatic hydrocarbon group, an aryl group or a heterocyclic group. $L^1$, $L^2$ and $L^3$ each represents a linking group. Y represents a nitrogen atom or a 1,3,5-benzenetriyl group.

$R^{61}$, $R^{62}$ and $R^{63}$ are the same as R in the formula (E-II), and preferred scopes thereof are also the same as described there. $Q^{61}$, $Q^{62}$ and $Q^{63}$ are the same as $Q^3$ in the formula (E-III), and preferred scopes thereof are also the same as described there. $L^1$, $L^2$ and $L^3$ are the same as L in the formula (E-I).

$L^1$, $L^2$ and $L^3$ each preferably represents a single bond, an arylene group, a divalent aromatic heterocyclic group or a linking group comprising a combination thereof, more preferably a single bond, a linking group comprising benzene, naphthalene, anthracene, pyridine, pyrazine, thiophene, furan, oxazole, thiazole, oxadiazole, thiadiazole or triazole, or a combination thereof, still more preferably a single bond or a linking group comprising benzene or thiophene, or a combination thereof, particularly preferably a single bond or a linking group comprising benzene, or a combination thereof, most preferably a single bond. $L^1$, $L^2$ and $L^3$ may have a substituent and, as the substituent, those referred to as substituents for the heterocyclic group represented by A in the formula (E-I) may be employed.

Y represents a nitrogen atom or a 1,3,5-benzenetriyl group, and the latter may have a substituent at 2-, 4- or 6-position. Examples of such substituent include an alkyl group, an aryl group and a halogen atom. Y is preferably a nitrogen atom or an unsubstituted 1,3,5-benzenetriyl group, with an unsubstituted 1,3,5-benzenetriyl group being more preferred.

Of the compounds represented by the formula (E-I), compounds represented by the formula (E-VII) are more preferred.

In the formula (E-VII), $R^{71}$, $R^{72}$ and $R^{73}$ each represents a hydrogen atom, an aliphatic hydrocarbon group, an aryl group or a heterocyclic group. $R^{74}$, $R^{75}$ and $R^{76}$ each represents a substituent. $p^1$, $p^2$ and $p^3$ each represents an integer of 0 to 3.

$R^{71}$, $R^{72}$ and $R^{73}$ are the same as R in the formula (E-II) and preferred scopes thereof are also the same as described there. $R^{74}$, $R^{75}$ and $R^{76}$ each represents a substituent and, as the substituent, those substituents which have been illustrated as substituents for the heterocyclic group represented by A in the formula (E-I) may be used. Preferred examples thereof are also the same as described there. Also, if possible, the substituents may be connected to each other to form a ring. $p^1$, $p^2$ and $p^3$ each represents an integer of from 0 to 3, preferably from 0 to 1, still more preferably 0.

Specific examples of the compound represented by the formula (E-I) are illustrated below which, however, do not limit the invention in any way.

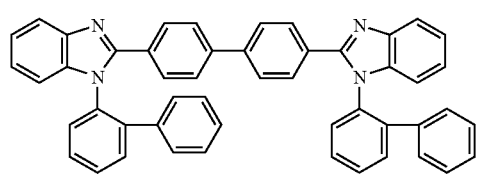

E-1

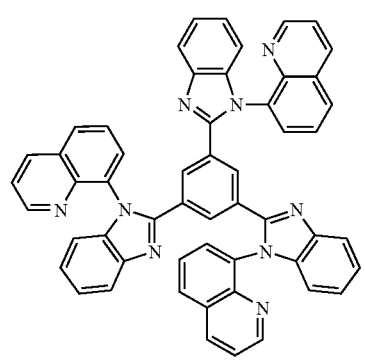

E-2

-continued
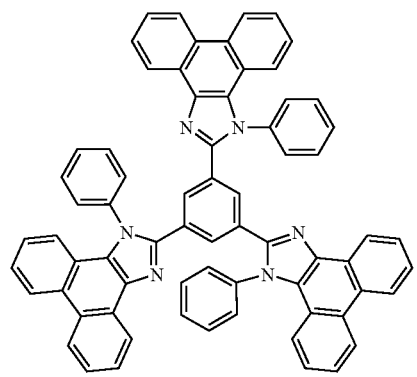
E-3
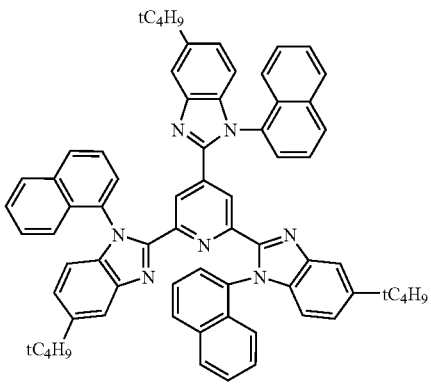
E-4
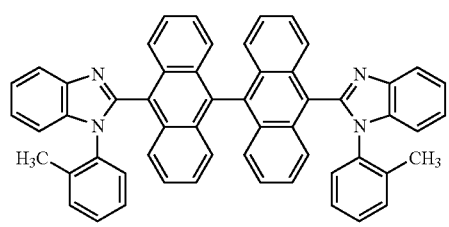
E-5
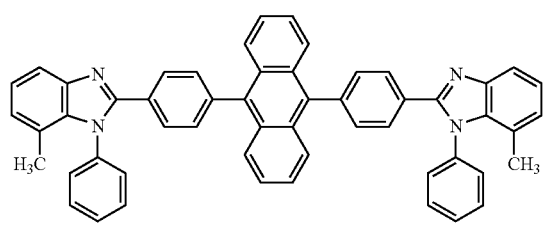
E-6
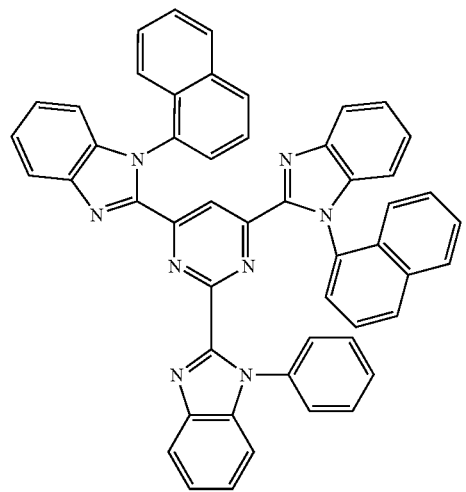
E-7
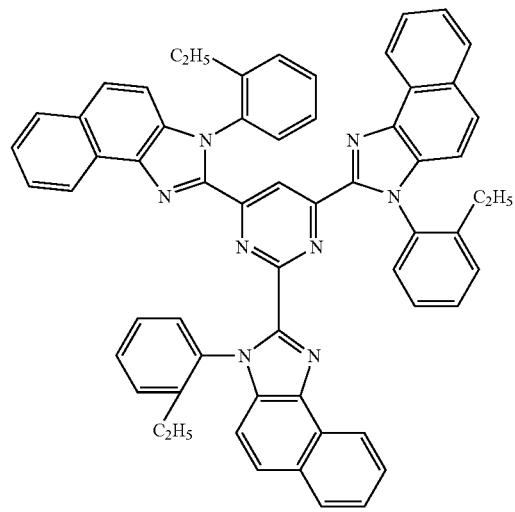
E-8
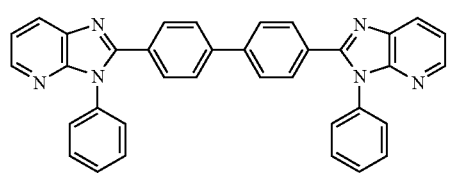
E-9
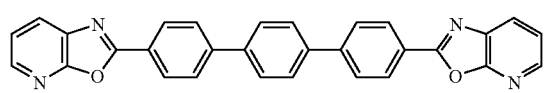
E-10
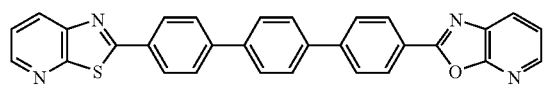
E-11
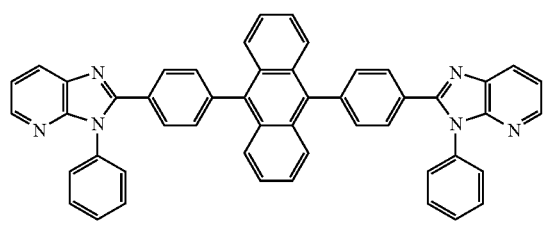
E-12
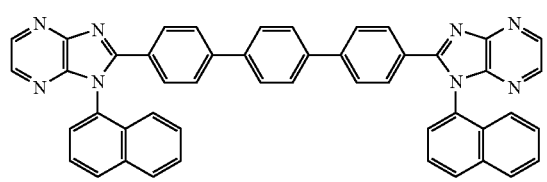
E-13

-continued
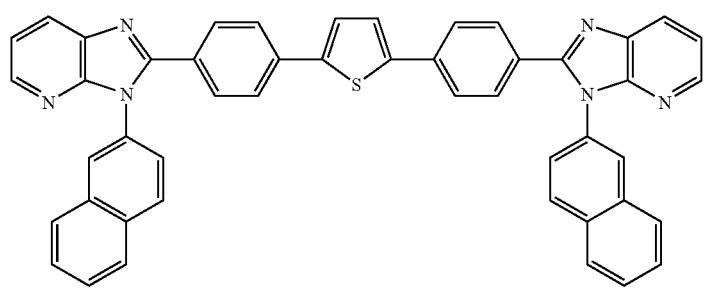
E-14
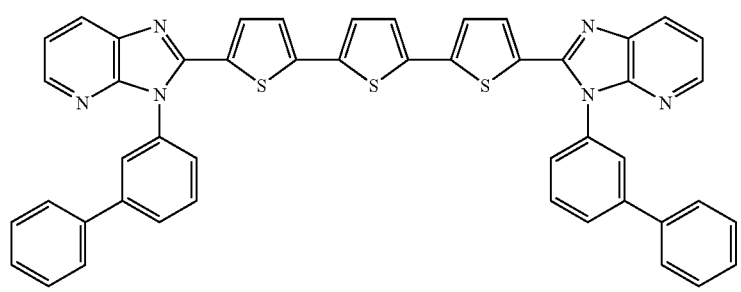
E-15
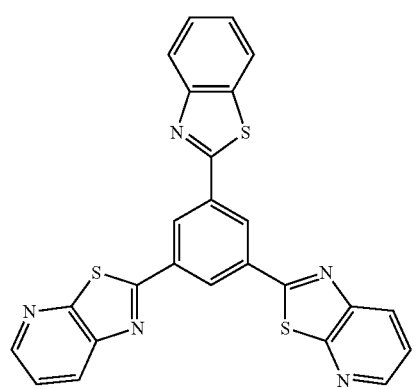
E-16
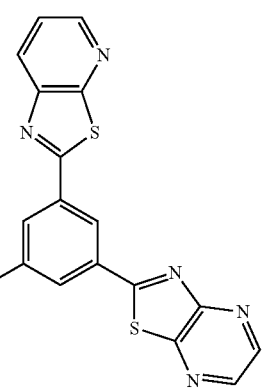
E-17
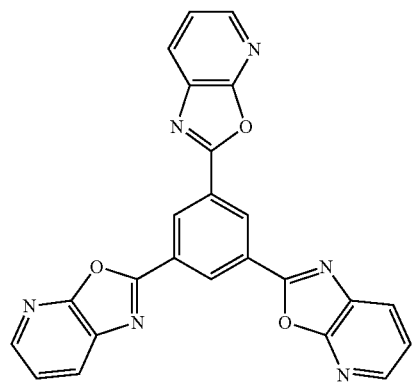
E-18
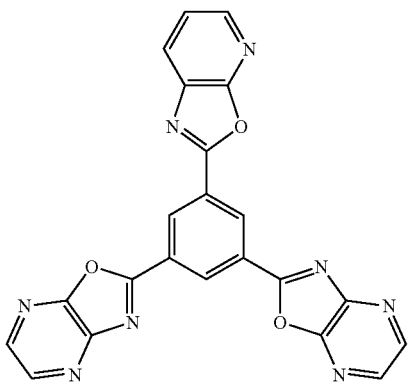
E-19

-continued
E-20
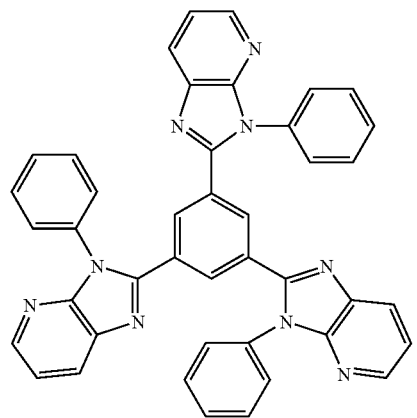
E-21
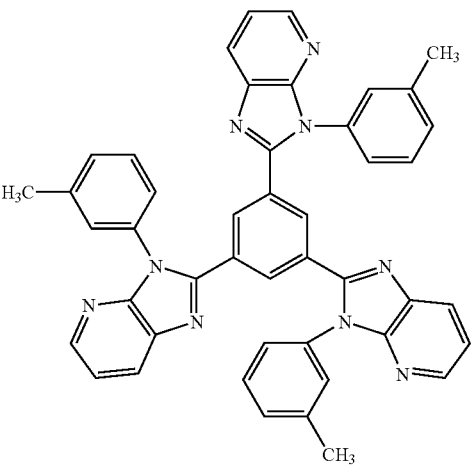
E-22
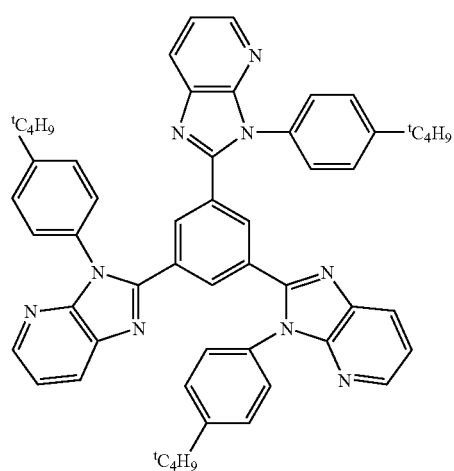
E-23
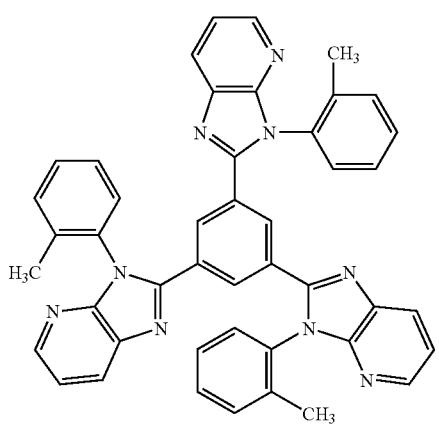
E-24
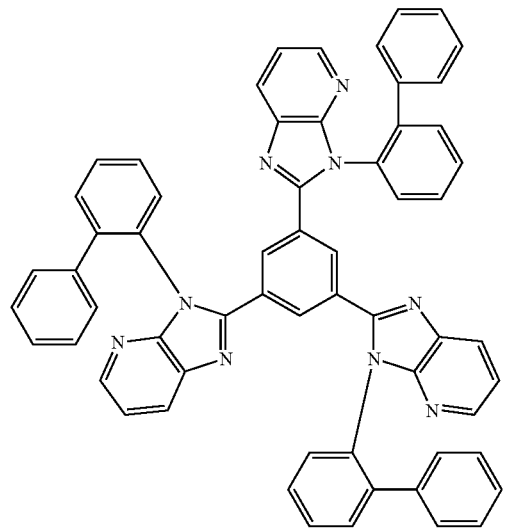
E-25
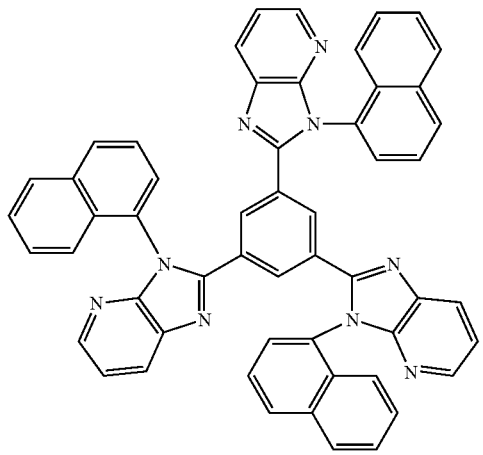

-continued
E-26
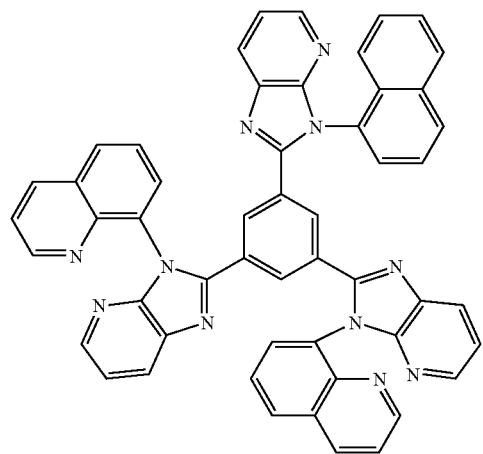
E-27
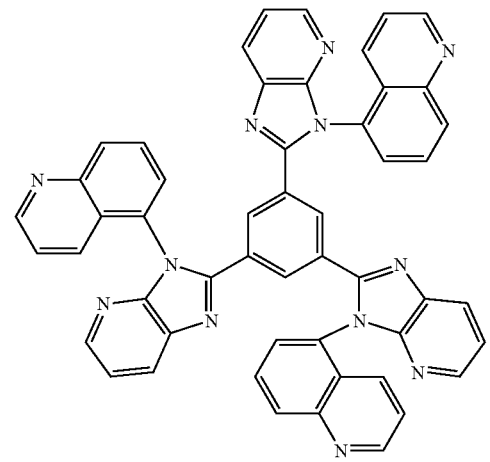
E-28
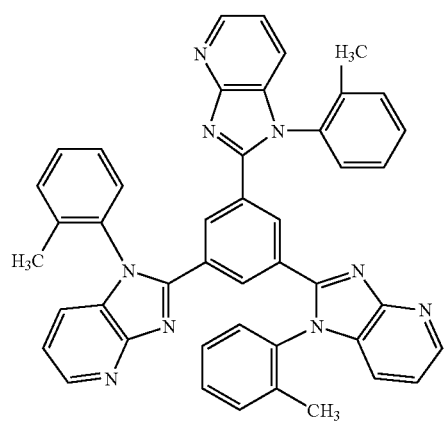
E-29
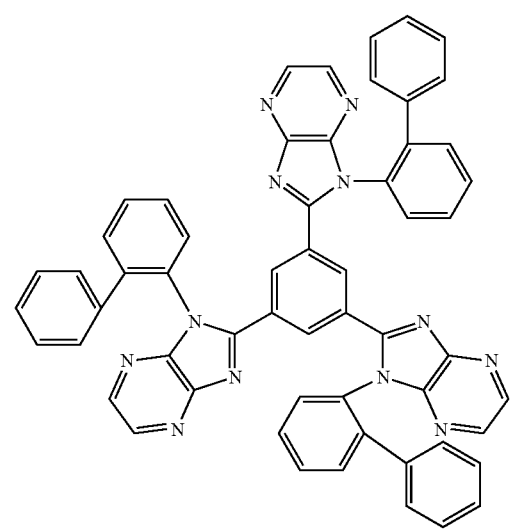
E-30
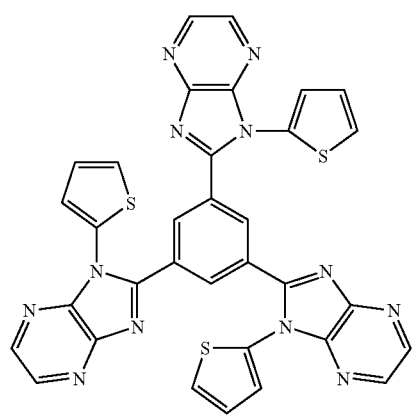
E-31
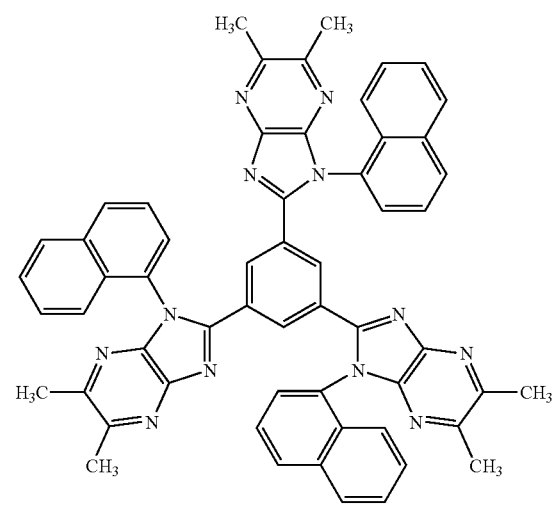

-continued
E-32
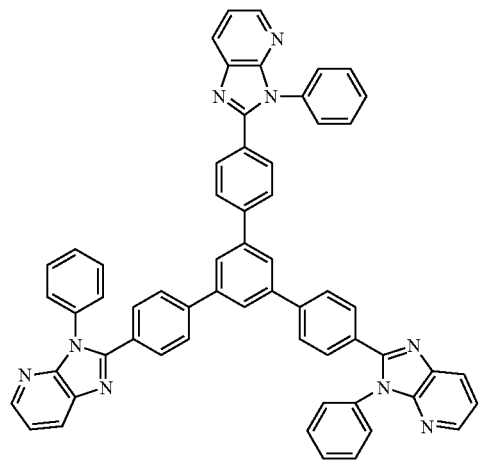
E-33
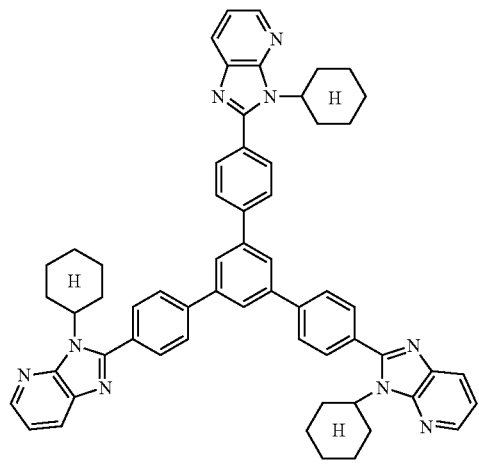
E-34
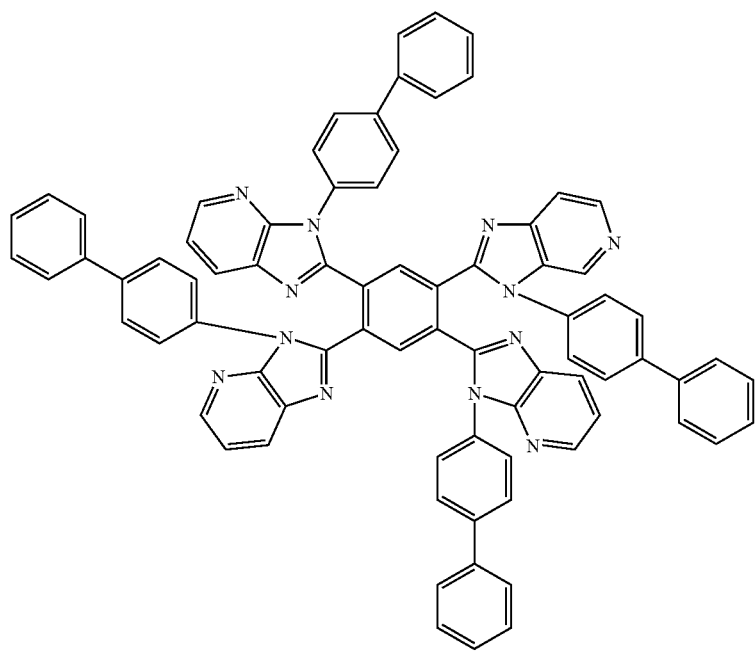
E-35
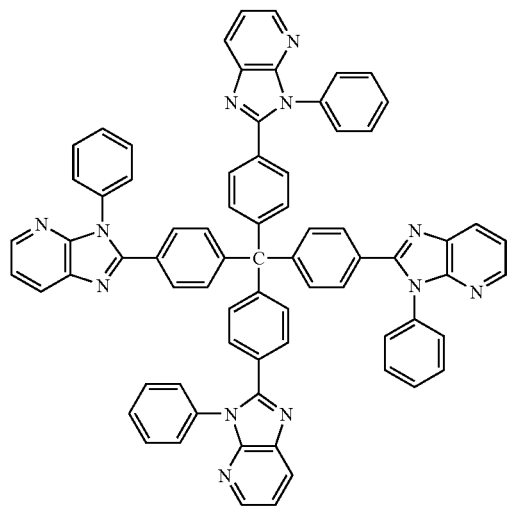
E-36
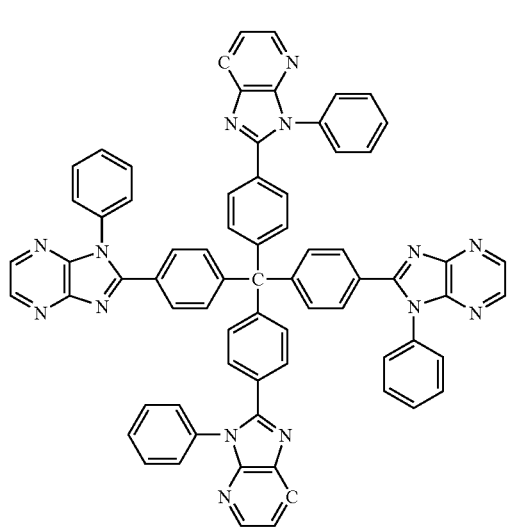

-continued
E-37
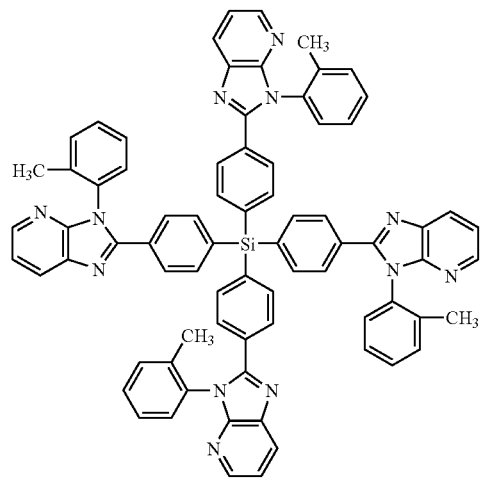
E-38
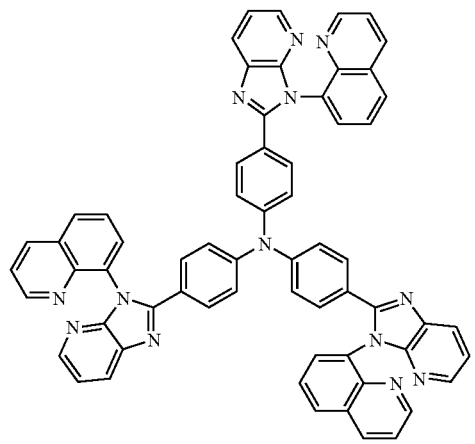
E-39
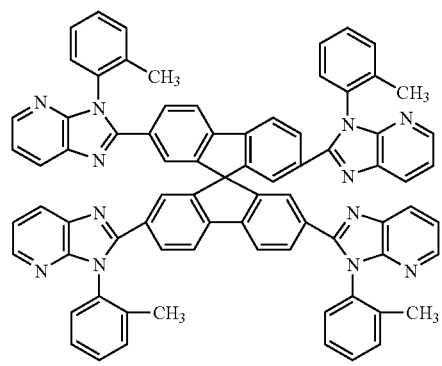
E-40
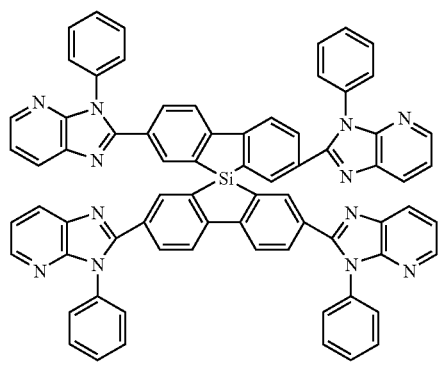
E-41
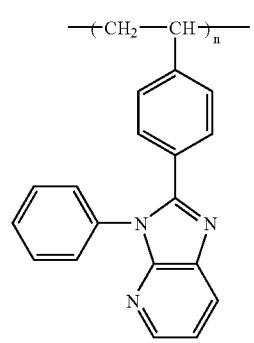

weight-average molecular weight (in terms of polystyrene): 16,500
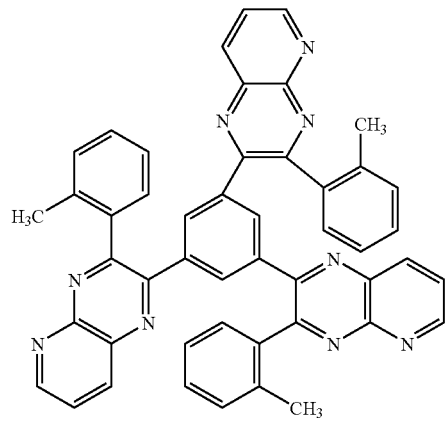
E-42
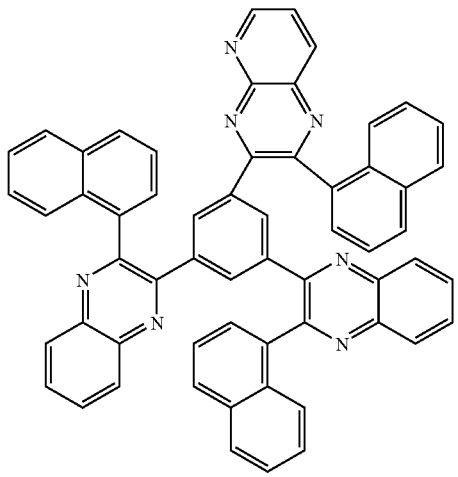
E-43
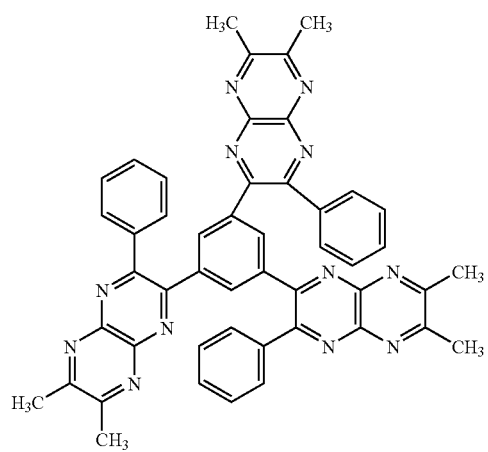
E-44
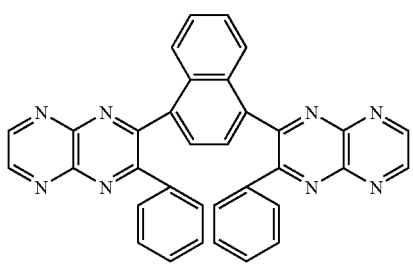
E-45
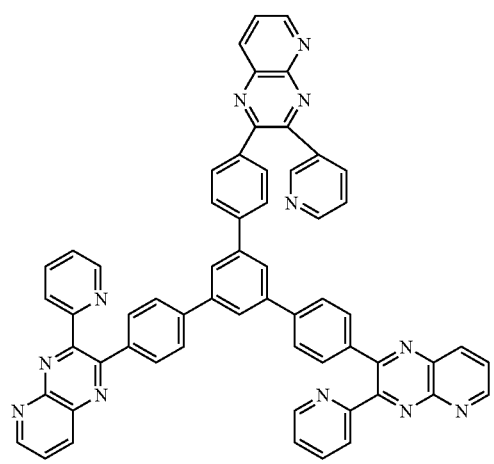
E-46
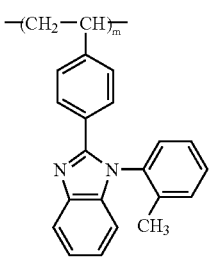
E-47 weight-average molecular weight (in terms of polystyrene): 21,000
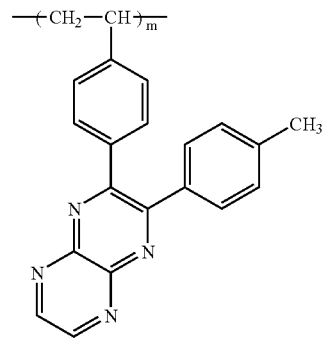
E-48
weight-average molecular weight (in terms of polystyrene): 14,000
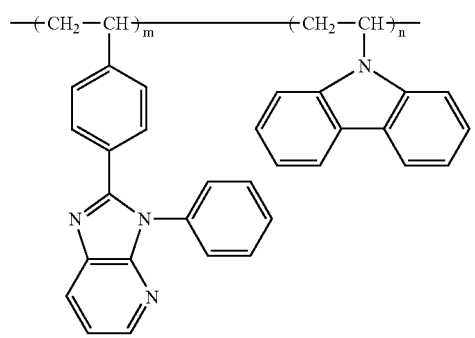
E-49
weight-average molecular weight (in terms of polystyrene): 17,000 m:n=1:1 (molar ratio)
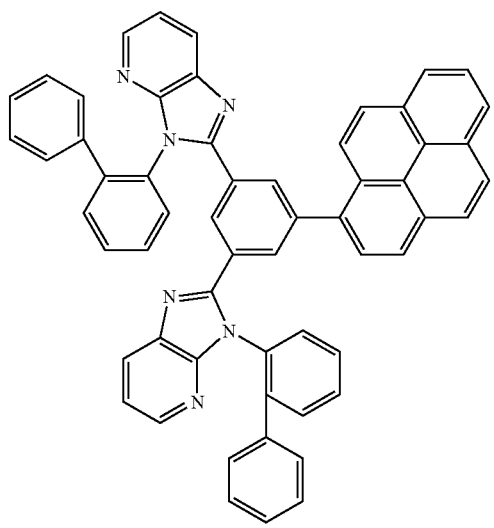
E-50
-continued
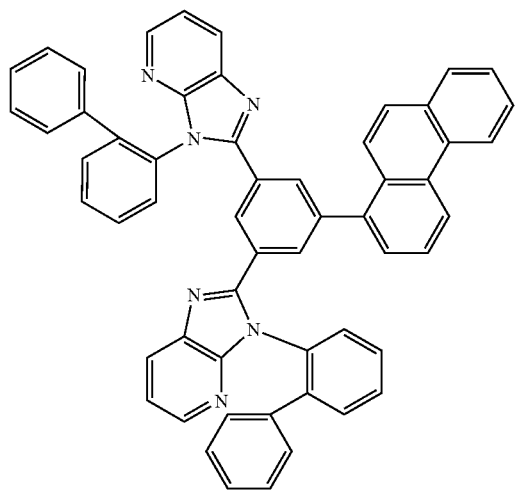
E-51
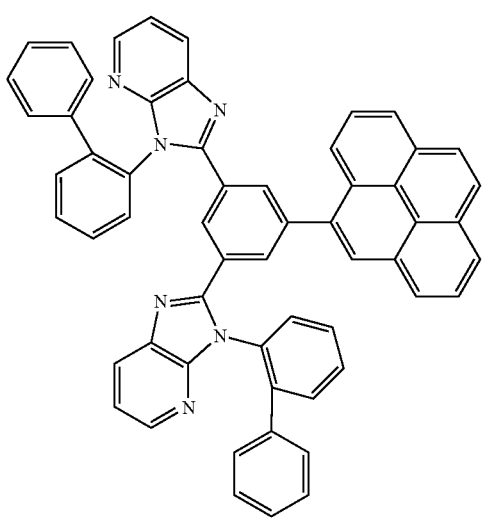
E-52
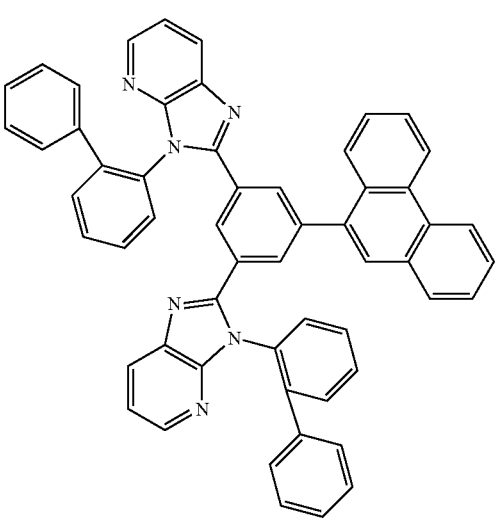
E-53

-continued

E-54
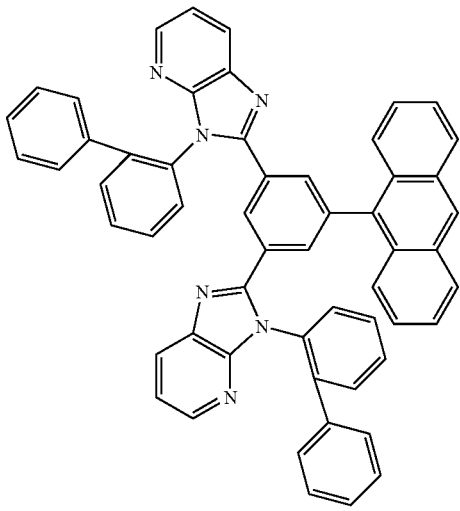

E-55
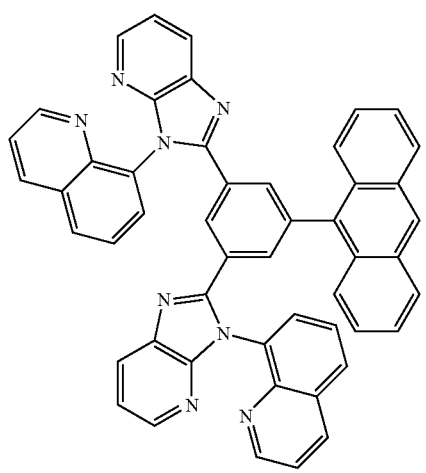

E-56

E-57
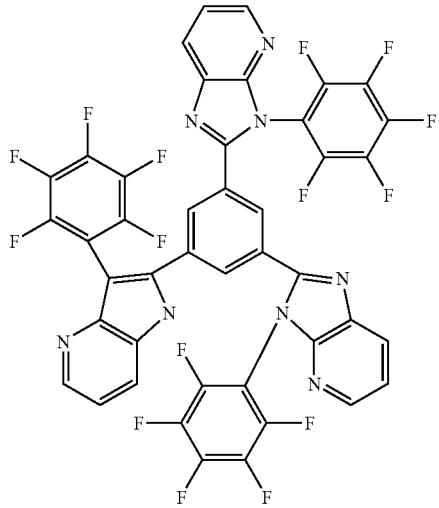

E-58
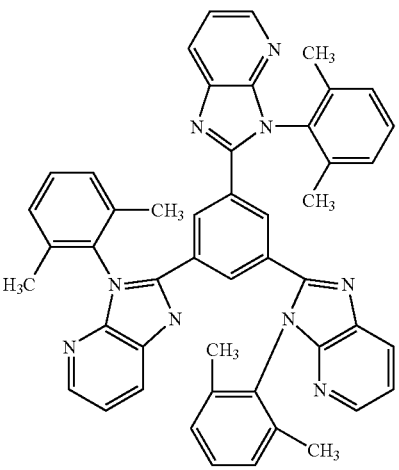

The compounds of the invention represented by the formulae (E-I) to (E-VII) can be synthesized by making reference to the processes described in JP-B-44-23025, JP-B-48-8842, JP-A-53-6331, JP-A-10-92578, U.S. Pat. Nos. 3,449,255, 5,766,779, *J. Am. Chem. Soc.*, 94, 2414 (1972), *Helv. Chim. Acta*, 63, 413 (1980) and *Liebigs Ann. Chem.*, 1423 (1982).

The organic EL element of the invention is characterized in that no other layer (preferably an organic layer, more preferably a hole-blocking layer) is provided between the light-emitting layer and the electron transporting layer. In particular, an organic EL element having a hole-blocking layer between a light-emitting layer and an electron transporting layer can suffer deterioration of light-emitting characteristics and deterioration of durability.

The light-emitting element of the invention is not particularly limited as to system, driving method and utilizing mode, and a proper mode may be employed.

The light-emitting element of the invention is not particularly limited as to process for forming the organic compound layer, and there may be employed an electrical resistance-heated vacuum deposition method, an electrophotographic method, an electron beam method, a sputtering method, a molecular lamination method, a coating method (e.g., a spray coating method, a dip coating method, an impregnating method, a roll coating method, a gravure coating method, a reverse coating method, a roll brushing method, an air knife coating method, a curtain coating method, a spin coating method, a flow coating method, a bar coating method, a microgravure coating method, an air doctor coating method, a blade coating method, a squeeze coating method, a transfer roll coating method, a kiss coating method, a cast coating method, an extrusion coating method, a wire bar coating method or a screen coating method), an ink jet method, a printing method or a transfer method. Of these, an electric resistance-heated vacuum deposition method, a coating method and a transfer method are preferred in consideration of characteristics of the element, ease of production and production cost. In the case where the light-emitting element has a layered structure of two or more layers, it is possible to produce it by combining the above-described methods with each other.

With the coating method, the compound may be dissolved or dispersed together with a resin component. Examples of the resin component include polyvinyl chloride, polycarbonate, polystyrene, polymethyl methacrylate, polyester, polysulfone, polyphenylene oxide, polybutadiene, poly(N-vinylcarbazole), hydrocarbon resin, ketone resin, phenoxy resin, polyamide, ethyl cellulose, vinyl acetate, ABS resin, polyurethane, melamine resin, unsaturated polyester resin, alkyd resin, epoxy resin and silicone resin.

The light-emitting element of the invention contains at least a light-emitting layer and, in addition, it may have a hole injecting layer, a hole transporting layer, an electron injecting layer, an electron transporting layer or a protective layer as an organic layer. Also, each of these layers may exert other function. Further, an organic EL element not having other layer sandwiched between the light-emitting layer and the electreon transporting layer is preferred. Each layer is described in detail below.

As materials for the hole injecting layer and the holoe transporting layer, any of those which have one of a function of injecting holes from an anode, a function of transporting holes, and a function of blocking electrons injected from a cathode may be used. Specific examples thereof include carbazole, imidazole, triazole, oxazole, oxadiazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine, aromatic dimethylidene compounds, porphyrin compounds, polysilane compounds, conductive high oligomers such as poly (N-vinylcarbazole), aniline copolymers, thiophene oligomers and polythiophene, organometalic complexes, transwition metal complexes and derivatives of the above-described compounds.

The thickness of the hole injecting layer or the hole transporting layer is not particularly limited, but is preferably in the range of from 1 nm to 5 µm, more preferably from 5 nm to 1 µm, still more preferably from 10 nm to 500 nm. The hole transporting layer maybe of a single-layered structure comprising one or more of the above-described materials or of a multi-layered structure comprising a plurality of the same composition or different compositions.

As materials for the electron injecting layer and the electron transporting layer, any of those which have one of a function of injecting electrons from a cathode, a function of transporting electrons, and a function of blocking holes injected from an anode may be used. Specific examples thereof include triazole, triazine, oxazole, oxadiazole, fluorenone, anthraquinodimethane, anthrone, diphenylquinone, thiopyran dioxide, carbodiimide, fluorenylidenemethane, distyrylpyrazine, silole, tetracarboxylic acid anhydride of an aromatic ring such as naphthalene or perylene, phthalocyanine, various metal complexes typically exemplified by metal complexes of 8-quinolinol derivatives or metal phthalocyanine and metal complexes containing as a ligand benzoxazole or benzothiazole, and derivatives of the above-described compounds.

The thickness of the electron injecting layer or the electron transporting layer is not particularly limited, but is preferably from 1 nm to 5 µm, more preferably from 5 nm to 1 µm, still more preferably from 10 nm to 500 nm. The electron injecting layer and the electron transporting layer may be of a single-layered structure comprising one or more of the above-described materials or of a multi-layered structure comprising a plurality of the same composition or different compositions.

The light-emitting layer in the invention contains at least one phosphorescence material and at least one metal complex, and it may further contain other plural materials. Examples of the materials to be used for the light-emitting layer include benzoxazole, benzimidazole, benzothiazole, styrylbenzene, polyphenyl, diphenylbutadiene, tetraphenylbutadiene, naphthalimide, coumarin, perylene, perynone, oxadiazole, aldazine, pyralidine, cyclopentadiene, bisstyrylanthracene, quinacridone, pyrrolopyridine, thiadiazolopyridine, styrylamine, aromatic dimetylidine compounds, polymer compounds such as polythiophene, polyphenylene and polyphenylenevinylene, and derivatives of the above-described compounds.

The light-emitting layer may be a single layer or a multi-layer composed of two or more layers. In the case where a plurality of the light-emitting layers are provided, each of the layers may emits a different light. In the case where a plurality of the light-emitting layers are provided, too, each of the light-emitting layers are constituted by preferably the phosphorescence material and the metal complex alone. The thickness of the light-emitting layer is not particularly limited, but is in the range of preferably from 1 nm to 5 µm, more preferably from 5 nm to 1 µm, still more preferably from 10 nm to 500 nm.

As the material for the protective layer, any of those which have a function of preventing invasion of materials accelerating deterioration of the element, such as moisture and oxygen, into the element is sufficient. Specific examples thereof include metals such as In, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$, metal fluorides such as $MgF_2$, LiF, $AlF_3$ and $CaF_2$, polyethylene, polypropylene, polymethyl methacrylate, polyimide, polyurea, polytetrafluoroethylene, polychlorotrifluoroethylene, polydichlorodifluoroethylene, chlorotrifluoroethylene/dichlorodifluoroethylene copolymer, a copolymer obtained by copolymerizing tetrafluoroethylene with a monomer mixture containing at least one comonomer, a fluorine-containing copolymer having a cyclic structure in the copolymer main chain, a water-absorbing substance having a water-absorbing ratio of 1% or more, and a moisture-proof substance having a water-absorbing ratio of 0.1% or less.

The method for forming the protective layer is not particularly limited, and there may be applied, for example, a vacuum deposition method, a sputtering method, a reactive sputtering method, an MBE (molecular beam epitaxy) method, a cluster ion beam method, an ion plating method, a plasma polymerization method (high-frequency excited ion plating method), a plasma CVD method, a laser CVD method, a thermal CVD method, a gas source CVD method, a coating method, an ink jet method, a printing method, a transfer method and an electrophotographic method.

The anode functions to feed holes to a hole injecting layer, a hole transporting layer and a light-emitting layer, and metals, alloys, metal oxides, electrically conductive compounds and mixtures thereof may be utilized for the anode, with those which have a work function of 4 eV or more being preferred. Specific examples thereof include conductive metal oxides such as tin oxide, zinc oxide, indium oxide and indium tin oxide (ITO), metals such as gold, silver, chromium and nickel, mixtures or laminates of these metals and conductive metal oxides, inorganic conductive materials such as copper iodide and copper sulfide, organic electrically conductive materials such as polyaniline, polythiophene and poloypyrrole, and mixtures or laminates of these and ITO, and preferred examples thereof include electrically conductive metal oxides. In particular, ITO is preferred in view of productivity, high conductivity and transparency. The thickness of the anode can properly be selected depending upon kind of the material, but is in the range of preferably from 10 nm to 5 μm, more preferably from 50 nm to 1 μm, still more preferably from 100 nm to 500 nm.

The anode to be used is usually formed as a layer on a substrate such as soda-lime glass, alkali-free glass or transparent resin. In the case of using glass, it is preferred to use alkali-free glass so as to reduce the amount of ion dissolved out of the glass. Also, in the case of using soda-lime glass, it is preferred to coat the soda-lime glass with a barrier such as silica. The thickness of the substrate is not particularly limited so long as the thickness is enough to maintain mechanical strength of the substrate and, in the case of using glass, the thickness is usually 0.2 mm or more, preferably 0.7 mm or more.

Various methods are employed for forming the anode depending upon kind of the materials used. In the case of, for example, ITO, the anode film is formed by an electron beam method, a sputtering method, an electrical resistance-heated vacuum deposition method, an ion plating method, a chemical reaction method (e.g., so-gel method), a spraying method, a dipping method, a thermal CVD method, a plasma CVD method or a method of coating a dispersion of ITO. It is possible to subject the anode to a treatment such as washing to thereby reduce driving voltage of the element and enhance light-emitting efficiency. For example, with ITO, UV-ozone treatment or plasma treatment is effective.

The cathode functions to feed electrons to an electron injecting layer, an electron transporting layer and a light-emitting layer, and is selected in consideration of adhesive properties to a layer to be in contact with the cathode such as the electron injecting layer, the electron transporting layer or the light-emitting layer, ionization potential and stability. As materials for the cathode, there may be used metals, alloys, metal oxides, electrically conductive compounds, and mixtures thereof. Specific examples thereof include alkali metals (e.g., Li, Na, K and Cs) or fluorides thereof, alkaline earth metals (e.g., Mg and Ca) or fluorides thereof, gold, silver, lead, aluminum, sodium-potassium alloy or mixture, lithium-aluminum alloy or mixture, magnesium-silver alloy or mixture, and rare earth metals such as indium and ytterbium. Preferred are materials having a work function of 4 eV or less, with aluminum, lithium-aluminum alloy or mixture and magnesium-silver alloy or mixture being more preferred. The thickness of the cathode can properly be selected depending upon kind of its material, but is in the range of preferably from 10 nm to 5 μm, more preferably from 50 nm to 1 μm, still more preferably from 100 nm to 1 μm. The cathode is formed by employing an electron beam method, a sputtering method, an electrical resistance-heated vacuum deposition method or a coating method. It is possible to vacuum-deposit a single metal or to vacuum-deposit two or more components at the same time. Further, it is also possible to form an alloy electrode by simultaneously vacuum-depositing a plurality of metals or, alternatively, a previously prepared alloy may be vacuum-deposited. As to the resistance of the anode or the cathode, the lower, the better. The resistance is preferably several hundreds $\Omega/\square$ ($\Omega$/square) or less.

The organic layer of the light-emitting element in accordance with the invention is preferably of a 3-layered structure composed of a hole transporting layer, a light-emitting layer and an electron transporting layer, or of a 4-layered structure having a hole blocking layer in addition to the three layers.

The light-emitting device of the present invention can enhance light extraction efficiency with various, publicly known measures. It is possible to enhance external quantum efficiency by improving light extraction efficiency, for example, by the following measures; processing the surface configuration of the support (for example, formation of fine concavo-convex patterns); control of the refractive indices of the support, the ITO layer and the organic layers; regulation of the thicknesses of the support, the ITO layer and the organic layers, etc.

The light emission device of the invention may also be of so-called top emission type in which the emitted light is taken out from the cathode side.

The support material used for the luminescent device of the invention is not specifically restricted, including inorganic materials such as zirconia-stabilized yttrium, glass, etc., macro-molecular weight materials such as polyesters exemplified by poly(ethylene terephthalate), poly(butylene terephthalate), poly(ethylene naphthalate), etc., polyethylene, polycarbonate, polyether sulfone, polyallylate, allyl diglycol carbonate, polyimide, polycyclo-olefin norbornene resin, poly(chlorotrifluoroethylene), teflon, polytetrafluoroethylene-polyethylene copolymer, etc.

The luminescent layer of the organic electroluminescent device in accordance with the invention may include at least one stacked layer structure. The number of the stacked layers may be preferably from 2 to 50, more preferably from 4 to 30, and still more preferably from 6 to 20.

The thickness of each layer constituting the stacked layer structure is not specifically limited, and is preferably from 0.2 nm to 20 nm, more preferably from 0.4 nm to 15 nm, still more preferably from 0.5 nm to 10 nm, and especially preferably from 1 nm to 5 nm.

The luminescent layer in the organic electroluminescent device of the present invention may have a plurality of domain structures. The luminescent layer may further contain another type of domain structure. The size of such individual domains is preferably from 0.2 nm to 10 nm, more preferably from 0.3 nm to 5 nm, still more preferably from 0.5 nm to 3 nm, and especially preferably from 0.7 nm to 2 mm.

The organic EL element of the invention can be preferably utilized as a display element or for display, backlight, electrophotography, light source for illumination, light source for recording, light source for exposure, light source for reading, signs, sign boards, the interior and optical communication.

EXAMPLES

The invention is described in more detail below. However, the invention should not be construed as being limited thereto.

Comparative Example 1

A washed ITO substrate was placed in a vacuum deposition apparatus, and TPD (N,N'-diphenyl-N,N'-di (m-tolyl) benzidine) was vacuum-deposited thereon as a hole transporting material in a thickness of 50 nm, and a host material of illustrative compound 58 (compound (H-4) described in paragraph [0034] of JP-A-2002-305083) and a phosphorescence material of Ir(ppy)$_3$ were vacuum-deposited thereon with a weight ratio of 17:1 in a thickness of 36-nm and, further, Alq was vacuum-deposited thereon as an electron transporting material. On the thus-obtained organic thin film was provided a patterned mask (light-emitting area being 4 mm×5 mm). After vacuum-depositing lithium fluoride in a thickness of 3 nm, aluminum was vacuum-deposited thereon in a thickness of 60 nm to prepare an organic EL element of Comparative Example 1.

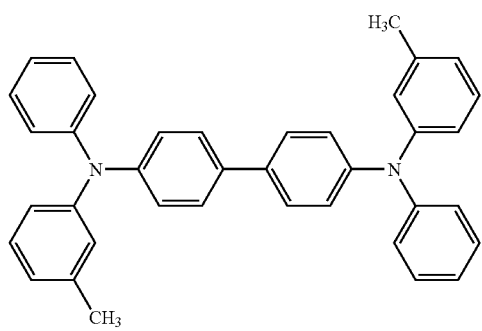
TPD

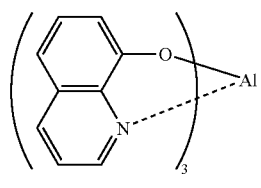
Alq

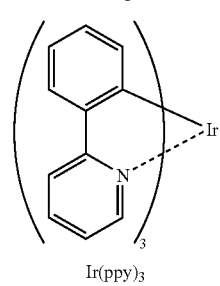
Ir(ppy)$_3$

A direct current constant voltage was applied to the thus-obtained organic EL element to emit light using a source measure unit Model 2400 made by Toyo Technica Corp. The luminance was measured by means of a luminance meter, BM-8, made by Topkon, and the wavelength of the emitted light and CIE chromaticity coordinates were measured by means of a spectrum analyzer, PMA-11, made by Hamamatsu Photonics Co., Ltd. As a result, there was obtained emission of a green light having CIE chromaticity coordinates of (x,y)=(0.324, 0.557) and an emission peak wavelength of 521 nm, with the maximum luminance being 3600 cd/m$^2$ and the outer quantum efficiency being 1.77%.

An organic EL element of Example 1 was prepared in the same manner as in Comparative Example 1 except for using illustrative compound E-26 as an electron transporting material in place of Alq. As a result of evaluation of the organic EL element of Example 1 in the same manner as in Comparative Example 1, there was obtained an emission of green light having the CIE chromaticity of (x,y)=(0.304, 0.621) and an emission peak wavelength of 517 nm, with the maximum luminance being 23000 cd/m$^2$ and the outer quantum efficiency being 18.8%.

Example 2

Ane organic EL element of the type set forth in Example 1 was fabricated in the same manner as in the foregoing Comparative Example 1 except that, instead of Alq, Illustrative Compound E-23 was used as an electron transport material. As a result of the evaluation of the organic EL element of the type of Example 1, green light emission that has a CIE chromaticity, (x, y)=(0.302, 0.624), with a emission peak wavelength of 515 nm was obtained. And the maximum luminance was 36500 cd/m$^2$ with an external quantum efficiency of 19.2%.

It is seen from Comparative Example 1 and Example 1 that use of a specific electron transporting material in a phosphorescence-emitting organic EL element using a metal complex as a host material shows markedly improved luminance and efficiency.

Comparative Example 2

A washed ITO substrate was placed in a vacuum deposition apparatus, and TPD (N,N'-diphenyl-N,N'-di(m-tolyl) benzidine) was vacuum-deposited thereon as a hole transporting material in a thickness of 50 nm, and a host material of illustrative compound 58 and a phosphorescence material of Ir(ppy)$_3$ were vacuum-deposited thereon with a weight ratio of 17:1 in a thickness of 36 nm and, further, SAlq of the following formula was vacuum-deposited thereon as a hole blocking layer in a thickness of 5 nm. On the thus-formed layer was vacuum-deposited Alq as an electron transporting material in a thickness of 31 nm. On the thus-obtained organic thin film was provided a patterned mask (light-emitting area being 4 mm×5 mm). After vacuum-depositing lithium fluoride in a thickness of 3 nm, aluminum was vacuum-deposited thereon in a thickness of 60 nm to prepare an organic EL element of Comparative Example 2. As a result of evaluation of the organic EL element of Comparative Example 2 in the same manner as in Comparative Example 1, there was obtained an emission of green light having the CIE chromaticity of (x,y)=(0.302, 0.624) and an emission peak wavelength of 519 nm, with the maximum luminance being 33000 cd/m² and the outer quantum efficiency being 15.5%.

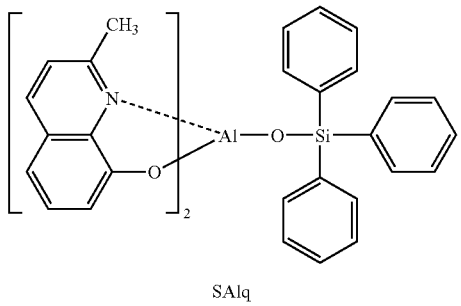

SAlq

Example 3

The half-value period of luminance including initial luminance was measured with the organic EL elements of Example 1, Example 2 and Comparative Example 2 and, as a result, the half-value period of the organic EL element obtained in Comparative Example 2 was found to be 4 hours, whereas that of the organic EL element obtained in Example 1 was found to be 78 hours, and that of the organic EL element obtained in Example 2 was found to be 120 hours.

It is seen from Example 3 that, among the phosphorescence-emitting organic EL elements using a metal complex as a host material, a phosphorescence-emitting element having no other organic layer between the light-emitting layer and the electron transporting layer shows a markedly improved driving durability.

Example 4

A dispersion of Baytron P (PEDOT-PSS (polyethylene dioxythiophene-polystyrenesulfonic acid dope; made by BAYER AG) coated on a washed ITO substrate by spin-coating, followed by heat-drying in vacuo at 100° C. for 1 hour to provide a hole injecting layer (film thickness: about 50 nm). On this layer was coated a solution of 10 mg of a binder of polycarbonate resin Z, 25 mg of a host material of the illustrative compound and 3 mg of a phosphorescence material of Ir(ppy)₃ in 3 ml of dichloroethane by spin coating (5000 rpm, 30 seconds). The total thickness of the organic layers was 100 nm. On this layer was vacuum-deposited an electron transporting material of the illustrative compound E-23 in a thickness of 30 nm. A cathode was vacuum-deposited in the same manner as in Comparative Example 1 to prepare an organic EL element of Example 4. As a result of evaluation of the organic EL element of Example 4 in the same manner as in Comparative Example 1, there was obtained an emission of green light having the CIE chromaticity of (x,y)=(0.307, 0.619) and an emission peak wavelength of 519 nm, with the maximum luminance being 19800 cd/m² and the outer quantum efficiency being 13.7%.

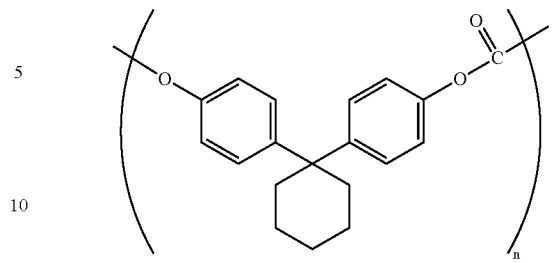

polycarbonate resin Z

It is seen from the results of Example 4 that a phosphorescence-emitting EL element using the metal complex as a host material prepared by the coating process also emits a light with high luminance and high efficiency.

The invention can provide a light-emitting element which shows a high luminance and a high outer quantum efficiency and has an excellent durability. Further, with organic EL elements having no other layer between a light-emitting layer and an electron transporting layer, their production process can be made simple, and costs on materials to be used can be depressed.

This application is based on Japanese Patent application JP 2002-365281, filed Dec. 17, 2002, and Japanese Patent application JP 2003-405677, filed Dec. 4, 2003, the entire contents of those are hereby incorporated by reference, the same as if set forth at length.

What is claimed is:

1. An organic electroluminescent element comprising:
a pair of electrodes; and
an organic layer between the pair of electrodes, the organic layer comprising a light-emitting layer and an electron transporting layer,
wherein the light-emitting layer contains at least one phosphorescence-emitting material and at least one metal complex functioning as a host material, and the electron transporting layer contains a compound represented by the formula (E-I):

$$L\text{-}(A)_m \quad (E\text{-}I)$$

wherein A represents a monovalent heterocyclic group wherein two or more aromatic hetero rings are condensed, the heterocyclic groups represented by A is the same or different from each other, m represents an integer of 2 or more, and L represents an m-valent linking group.

2. The organic electroluminescent element according to claim 1, wherein the compound of the formula (E-I) is a compound represented by the formula (E-II):

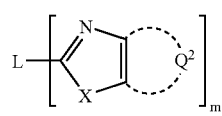

wherein X represents O, S, Se, Te or N—R, R represents a hydrogen atom, an aliphatic hydrocarbon group, an aryl group or a heterocyclic group, Q² represents atoms necessary for forming an aromatic hetero ring, m represents an integer of 2 or more, and L represents an m-valent linking group.

3. The organic electroluminescent element according to claim 1, wherein the compound of the formula (E-I) is a compound represented by the formula (E-III):

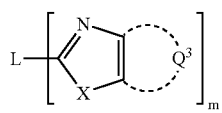

(E-III)

wherein X represents O, S, Se, Te or N—R, R represents a hydrogen atom, an aliphatic hydrocarbon group, an aryl group or a heterocyclic group, $Q^3$ represents atoms necessary for forming a nitrogen-containing aromatic hetero ring, m represents an integer of 2 or more, and L represents an m-valent linking group.

4. The organic electroluminescent element according to claim 1, wherein the compound of the formula (E-I) is a compound represented by the formula (E-IV):

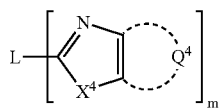

(E-IV)

wherein $X^4$ represents O, S or N—R, R represents a hydrogen atom, an aliphatic hydrocarbon group, an aryl group or a heterocyclic group, $Q^4$ represents atoms necessary for forming a 6-membered, nitrogen-containing aromatic hetero ring, m represents an integer of 2 to 8, and L represents an m-valent linking group.

5. The organic electroluminescent element according to claim 1, wherein the compound of the formula (E-I) is a compound represented by the formula (E-V):

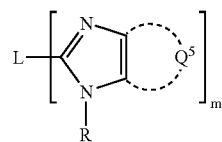

(E-V)

wherein R represents a hydrogen atom, an aliphatic hydrocarbon group, an aryl group or a heterocyclic group, $Q^5$ represents atoms necessary for forming a 6-membered, nitrogen-containing aromatic hetero ring, m represents an integer of from 2 to 8, and L represents an m-valent linking group.

6. The organic electroluminescent element according to claim 1, wherein the compound of the formula (E-I) is a compound represented by the formula (E-VI):

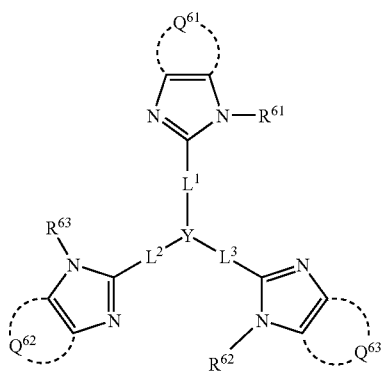

(E-VI)

wherein $Q^{61}$, $Q^{62}$ and $Q^{63}$ each independently represents atoms necessary for forming a 6-membered, nitrogen-containing aromatic hetero ring, $R^{61}$, $R^{62}$ and $R^{63}$ each independently represents a hydrogen atom, an aliphatic hydrocarbon group, an aryl group or a heterocyclic group, $L^1$, $L^2$ and $L^3$ each independently represents a divalent linking group, and Y represents a nitrogen atom or a 1,3,5-benzenetriyl group.

7. The organic electroluminescent element according to claim 1, wherein the compound of the formula (E-I) is a compound represented by the formula (E-VII):

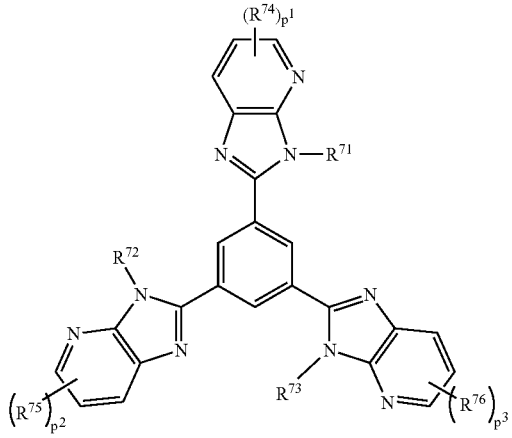

(E-VII)

wherein $R^{71}$, $R^{72}$ and $R^{73}$ each independently represents a hydrogen atom, an aliphatic hydrocarbon group, an aryl group or a heterocyclic group, $R^{74}$, $R^{75}$ and $R^{76}$ each independently represents a substituent, and $p^1$, $p^2$ and $p^3$ each represents an integer of 0 to 3.

8. The organic electroluminescent element according to claim 1, wherein the light-emitting layer is provided directly on the electron transporting layer.

9. The organic electroluminescent element according to claim 1, wherein the metal complex is represented by the formula (H-4):

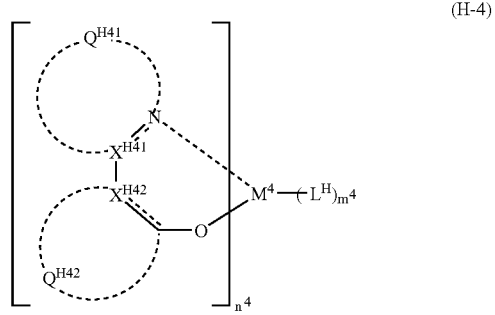

(H-4)

wherein $X^{H41}$ and $X^{H42}$ each independently represents a carbon atom or a nitrogen atom, the bond between $X^{H41}$ and the nitrogen atom and the bond between $X^{H42}$ and the carbon atom each independently represents a single bond or a double bond, $Q^{H41}$ and $Q^{H42}$ each independently represents atoms necessary for forming a 5- or 6-membered ring, $M^4$ represents a metal ion, $n^4$ represents an integer of 1 or more, $L^H$ represents a ligand, and $m^4$ represents an integer of 0 or more.

10. The organic electroluminescent element according to claim 1, wherein the light-emitting layer contains from 50 to 99.9% by weight of the at least one metal complex.

11. The organic electroluminescent element according to claim 1, wherein the light-emitting layer contains from 60 to 99% by weight of the at least one metal complex.

12. The organic electroluminescent element according to claim 1, wherein the metal complex has a glass transition temperature of from 130 to 400° C.

13. The organic electroluminescent element according to claim 1, wherein the metal complex is a complex of Li, Be, Na, Mg, Al, K, Ca, Sc, Ti, V, Cr, Mn, Fe, Co, Ni, Cu, Zn, Ga or Ge.

14. The organic electroluminescent element according to claim 1, wherein the metal complex is a complex of Li, Be, Na, Mg, Al, Ti, Fe, Co, Ni, Cu, Zn or Ga.

15. The organic electroluminescent element according to claim 1, wherein the metal complex is a complex of Be, Mg, Al, Fe, Ni, Cu, Zn or Ga.

16. The organic electroluminescent element according to claim 1, wherein the metal complex is a complex of Be, Mg, Al, Cu, Zn or Ga.

17. The organic electroluminescent element according to claim 1, wherein the metal complex is a complex of Al or Zn.

18. The organic electroluminescent element according to claim 1, wherein the phosphorescence-emitting material is a complex of iridium, platinum, rhenium or ruthenium.

19. The organic electroluminescent element according to claim 1, wherein the phosphorescence-emitting material is a complex of iridium or platinum.

20. The organic electroluminescent element according to claim 1, wherein the phosphorescence-emitting material is a complex of iridium.

* * * * *